(12) United States Patent
Makiyama et al.

(10) Patent No.: US 10,056,406 B2
(45) Date of Patent: Aug. 21, 2018

(54) SEMICONDUCTOR INTEGRATED CIRCUIT DEVICE COMPRISING MISFETS IN SOI AND BULK SUBTRATE REGIONS

(71) Applicant: RENESAS ELECTRONICS CORPORATION, Tokyo (JP)

(72) Inventors: Hideki Makiyama, Tokyo (JP); Yoshiki Yamamoto, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/924,527

(22) Filed: Oct. 27, 2015

(65) Prior Publication Data

US 2016/0064416 A1    Mar. 3, 2016

Related U.S. Application Data

(62) Division of application No. 13/620,986, filed on Sep. 15, 2012, now Pat. No. 9,202,761.

(30) Foreign Application Priority Data

Oct. 11, 2011 (JP) .................. 2011-223666

(51) Int. Cl.
*H01L 27/12* (2006.01)
*H01L 21/84* (2006.01)
(Continued)

(52) U.S. Cl.
CPC .......... *H01L 27/1207* (2013.01); *H01L 21/84* (2013.01); *H01L 27/1203* (2013.01); *H01L 29/0649* (2013.01); *H01L 29/0684* (2013.01); *H01L 29/42356* (2013.01); *H01L 29/66545* (2013.01); *H01L 21/82385* (2013.01); (Continued)

(58) Field of Classification Search
CPC ...................................................... H01L 27/12
See application file for complete search history.

(56) References Cited

U.S. PATENT DOCUMENTS 6,004,866 A * 12/1999 Nakano ............... H01L 21/2007
257/E21.122
7,297,618 B1    11/2007 Henson et al.
(Continued)

FOREIGN PATENT DOCUMENTS

JP    2007-294945 A    11/2007
JP    2008066715 A    3/2008
(Continued)

OTHER PUBLICATIONS

Japanese Notification of Reasons for Refusal, issued in corresponding Japanese Patent Application No. 2011-223666, dated Apr. 16, 2015; 9 pages with English translation.
(Continued)

*Primary Examiner* — Ismail Muse
(74) *Attorney, Agent, or Firm* — McDermott Will & Emery LLP

(57) ABSTRACT

The semiconductor integrated circuit device has a hybrid substrate structure which includes both of an SOI structure and a bulk structure on the side of the device plane of a semiconductor substrate. In the device, the height of a gate electrode of an SOI type MISFET is higher than that of a gate electrode of a bulk type MISFET with respect to the device plane.

6 Claims, 33 Drawing Sheets

(51) Int. Cl.
*H01L 29/66* (2006.01)
*H01L 29/06* (2006.01)
*H01L 29/423* (2006.01)
*H01L 21/8238* (2006.01)

(52) U.S. Cl.
CPC ........... *H01L 21/823814* (2013.01); *H01L 21/823878* (2013.01)

(56) References Cited

U.S. PATENT DOCUMENTS

| | | | |
|---|---|---|---|
| 7,663,192 B2 | 2/2010 | Sell et al. | |
| 8,211,786 B2* | 7/2012 | Cheng | H01L 21/823807 257/255 |
| 2004/0094805 A1* | 5/2004 | Hokazono | H01L 21/823412 257/382 |
| 2005/0082531 A1 | 4/2005 | Rim | |
| 2006/0121678 A1 | 6/2006 | Brask et al. | |
| 2006/0175659 A1 | 8/2006 | Sleight | |
| 2006/0261410 A1 | 11/2006 | Ohguro | |
| 2007/0212857 A1* | 9/2007 | Anderson | H01L 21/76275 438/478 |
| 2008/0023778 A1 | 1/2008 | Henson et al. | |
| 2008/0036008 A1* | 2/2008 | Hirase | H01L 21/82345 257/369 |
| 2009/0014812 A1* | 1/2009 | Wang | H01L 21/82385 257/392 |
| 2009/0096036 A1* | 4/2009 | Ishigaki | H01L 21/823418 257/392 |
| 2010/0052034 A1* | 3/2010 | Cheng | H01L 29/66825 257/316 |
| 2010/0084709 A1* | 4/2010 | Tsuchiya | H01L 21/823878 257/347 |
| 2011/0175168 A1* | 7/2011 | Wang | H01L 21/823807 257/369 |
| 2011/0195566 A1 | 8/2011 | Ishigaki et al. | |
| 2011/0303989 A1* | 12/2011 | Chuang | H01L 23/5256 257/380 |
| 2011/0309451 A1* | 12/2011 | Tsukamoto | H01L 21/28114 257/369 |
| 2012/0080754 A1* | 4/2012 | Ema | H01L 21/761 257/368 |
| 2012/0083079 A1* | 4/2012 | Oh | H01L 21/3221 438/162 |
| 2012/0146148 A1* | 6/2012 | Iwamatsu | H01L 27/1207 257/351 |

FOREIGN PATENT DOCUMENTS

| | | |
|---|---|---|
| JP | 2008085138 A | 4/2008 |
| JP | 2008523591 A | 7/2008 |
| JP | 2009094369 A | 4/2009 |
| JP | 2009545168 A | 12/2009 |
| JP | 2011049282 A | 3/2011 |
| WO | 2008014038 A1 | 1/2008 |

OTHER PUBLICATIONS

R. Tsuchiya et al., "Silicon on Thin Box: A New Paradigm of the CMOSFET for low-Power and High-Performance Application Featuring Wide-Range Back-Bias Control," IEEE 2004.

\* cited by examiner

SEMICONDUCTOR INTEGRATED CIRCUIT DEVICE COMPRISING MISFETS IN SOI AND BULK SUBTRATE REGIONS

CROSS-REFERENCE TO RELATED APPLICATIONS

This application is a divisional of U.S. application Ser. No. 13/620,986, filed on Sep. 15, 2012, now U.S. Pat. No. 9,202,761, which claims the benefit of Japanese Application No. 2011-223666 filed Oct. 11, 2011, the entire contents of each are hereby incorporated by reference.

BACKGROUND

The present invention relates to a substrate of a semiconductor integrated circuit device (or semiconductor device) and a gate structure thereof, and a technique useful in application to Front End of Line (FEOL) process technology in a method for manufacturing a semiconductor integrated circuit device (or semiconductor device).

The Unexamined Japanese Patent Publication (JP-A) No. 2009-94369, hereinafter referred to as "Patent Document 1", and the US Patent Publication No. 2009-96036 corresponding to it, hereinafter referred to as "Patent Document 2" disclose a technique for forming a bulk region in part of SOI (Silicon on Insulator) wafer.

The Japanese Translation of PCT International Application Publication (JP-T) No. 2008-523591 (Patent Document 3), and the U.S. Pat. No. 7,663,192 (Patent Document 4) corresponding to it disclose a single High-k/dual metal type gate-last process.

The JP-T-2009-545168 (Patent Document 5) and the International Publication WO 2008/14038 (Patent Document 6) corresponding to it disclose a so-called FUSI (Fully Silicided) gate technology.

The JP-A-2011-49282 (Patent Document 7) discloses a technique for providing, in a bulk substrate structure, both MISFET (Metal Insulator Semiconductor Field Effect Transistor) having a polycrystalline silicon gate electrode structure according to a gate-first method, and MISFET having a metal gate electrode structure according to a gate-last method.

A technique for controlling, by means of a back gate bias, the threshold voltage of a transistor, and other various properties thereof is disclosed by R. Tsuchiya and other eight in "Silicon on Thin BOX: A New Paradigm of The CMOSFET for Low-Power and High-Performance Application Featuring Wide-Range Back-Bias Control", IEDM Tech. 2004, pp. 631-634 (Nonpatent Document 1).

SUMMARY

Because of having both of an SOI-MISFET and a bulk-MISFET, a semiconductor integrated circuit device having a hybrid substrate structure including both an SOI structure and a bulk structure has needed to be designed in structure (specifically adjusted in threshold voltage and the like) so as to adapt to respective gate materials in manufacturing both types of MISFETs by the gate-first method. A lot of knowledge has been accumulated as to bulk-MISFETs, and the change in structure attributed to the change in gate material will lead to the increase in development cost. Therefore, there is still demand for keeping the bulk-MISFET structure as far as possible. In the case of changing the gate electrode material according to the conventional gate-last method, lithography must be used to select a region, which would lead to problems such as a more complicated process and the increase in manufacturing cost.

The invention is made to solve the problems.

It is an object of the invention to provide a highly reliable semiconductor integrated circuit device, and a highly reliable manufacturing process thereof.

The above and other object of the invention and novel features thereof will become apparent from the description hereof and the accompanying drawings.

Of the embodiments of the invention herein disclosed, the representative embodiment will be outlined below in brief.

Provided according to one embodiment of the invention is a semiconductor integrated circuit device having a hybrid substrate structure which includes both of an SOI structure and a bulk structure on a device plane of the semiconductor substrate. The semiconductor integrated circuit device is arranged so that the height of a gate electrode of an SOI type MISFET with respect to the device plane is higher than that of a gate electrode of a bulk type MISFET.

The effect that the representative embodiment brings about is as described below in brief.

It becomes possible to increase the reliability of a semiconductor integrated circuit device, and that of a manufacturing process thereof.

DETAILED DESCRIPTION

Figure 1:
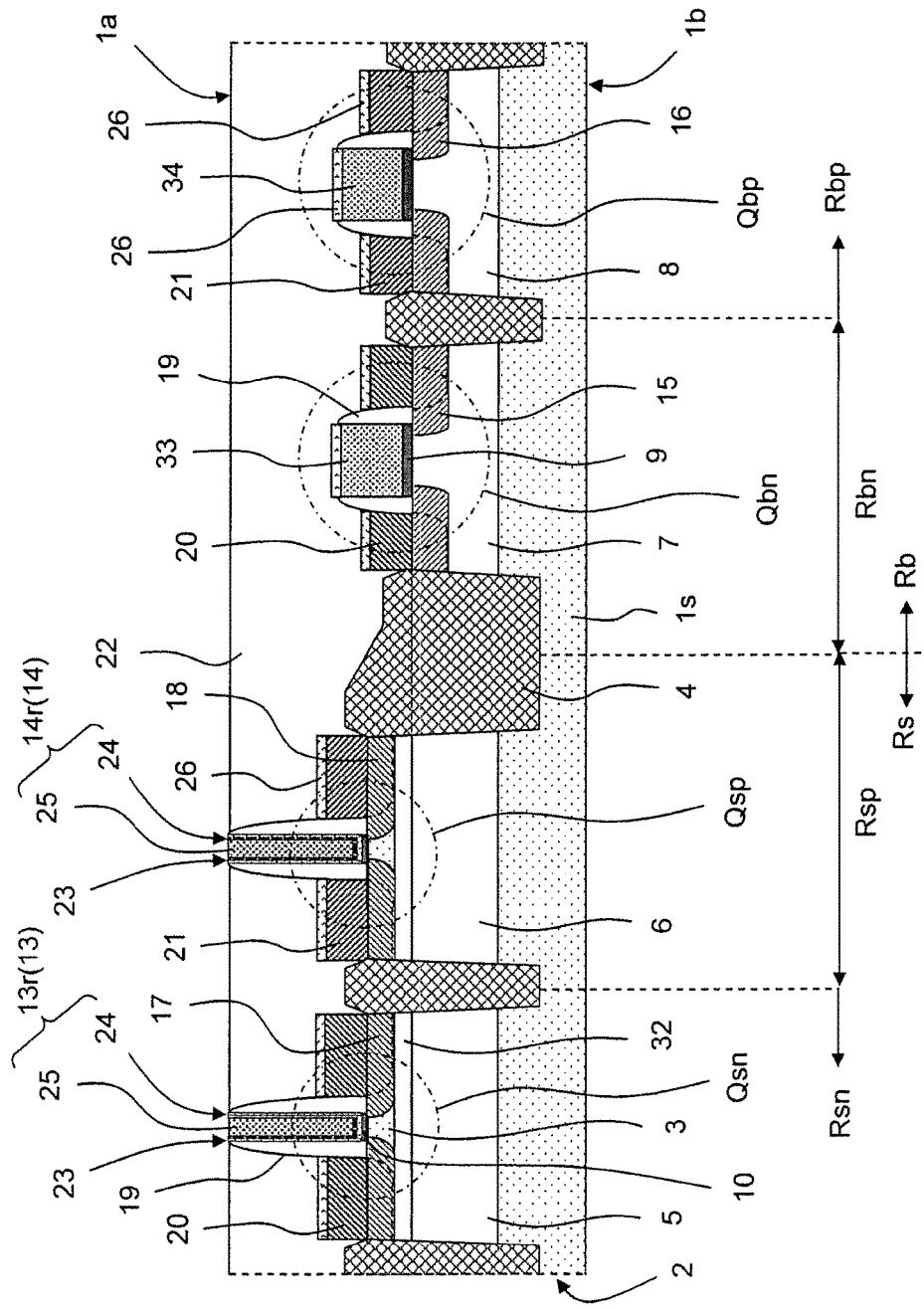
FIG. 1 is a device sectional view for explaining a device structure (i.e. a constant-elevation substrate top face type device) in connection with an example of a semiconductor integrated circuit device according to an embodiment of the invention.

[1] Further Detailed Description of the Embodiments

The Description Form Hereof, Basic Terms, and their Usage

1. The description on one embodiment is herein divided into more than one section for convenience as needed. What described in the sections are not independent of each other; one of which may form a part of one embodiment, a detail of another, or part or all of a modification or the like except when a different mater is particularly and clearly described. Further, the second or later description on like parts shall be omitted to avoid the iteration of the description thereof as a rule. In addition, every constituent of the embodiments are not essential except when a different matter is particularly and clearly described, when it is logically limited so in number, and when that is apparently denied from the context.

The terms "semiconductor device" and "semiconductor integrated circuit device" herein used chiefly refer to a device including one of various types of transistors (active elements), and a resistor, a capacitor, and other components arranged around the transistor which are integrated into a chip or on something of that sort, e.g. a monocrystalline silicon substrate. A representative example of the various types of transistors is MISFET (Metal Insulator Semiconductor Field Effect Transistor) typified by MOSFET (Metal Oxide Semiconductor Field Effect Transistor). In this case, a representative example arranged as an integrated circuit is CMIS (Complementary Metal Insulator Semiconductor) type integrated circuit typified by CMOS (Complementary Metal Oxide Semiconductor) type integrated circuit including a combination of N-channel type and P-channel type MISFETs.

Usually, the wafer processes of today's semiconductor integrated circuit device, namely LSI (Large Scale Integration) are roughly classified into: FEOL (Front End of Line) process which includes a series of steps from the carrying in of a silicon wafer as a raw material to the Premetal step (including the formation of an interlayer insulative film and the like between the M1 wiring layer lower end and a gate electrode structure, the formation of a contact hole, and the embedding of a tungsten plug); and BEOL (Back End of Line) process which includes a series of steps starting with the formation of M1 wiring layer to the formation of a pad opening on a final passivation film on an aluminum-based pad electrode or another step near the formation step (if the wafer level packaging process is involved, including that process).

2. Likewise, in the descriptions on the embodiments and others, the expression "X comprising A" concerning material, composition, etc. never exclude the idea that a component or part other than A makes one of chief constituents of the embodiment of interest except when it is particularly described that the component or part does not form one chief constituent, and when that is apparently denied from the context. For instance, as to ingredients, "X comprising A" means "X including A as a chief ingredient". For example, the term "silicon material" is not limited to "pure silicon". It is obvious that the silicon material includes SiGe alloy, and another kind of multi-element alloy containing silicon as a chief ingredient, and materials containing other additives, etc. Also, it is obvious that what "silicon oxide film" and "silicon oxide-based insulative film" used herein mean include not only a film of relatively pure undoped silicon dioxide, but thermal oxide films of FSG (Fluorosilicate Glass), TEOS-based silicon dioxide (TEOS-based silicon dioxide), SiOC (Silicon Oxicarbide) and carbon-doped silicon dioxide (Carbon-doped Silicon oxide), and OSG (Organosilicate glass), PSG (Phosphorus Silicate Glass), BPSG (Borophosphosilicate Glass) and the like, CVD oxide films thereof, silicon dioxide films formed by coating, such as SOG (Spin ON Glass) film and NCS (Nano-Clustering Silica) film, silica-based Low-k insulative films (porous insulative films) which includes films of materials identical to these materials, but having pores formed therein, and a composite film which includes one of these films as a chief constituent and another silicon-based insulative film.

Silicon-based insulative films as commonly used in the field of semiconductors as silicon oxide-based insulative films include silicon nitride-based insulative films. The materials that such kind of films are made of include SiN, SiCN, SiNH, and SiCNH. Now, it is noted that "silicon nitride" used herein includes both of SiN and SiNH except when something different is particularly described. Likewise, "SiCN" includes both of SiCN and SiCNH except when a different matter is particularly and clearly described.

Now, it is noted that SiC has a similar property to that of SiN, however SiON film should be classified as a silicon oxide-based insulative film in many cases.

Silicon nitride films are frequently used as an etching stop film, namely CESL (Contact Etch-Stop Layer) in SAC (Self-Aligned Contact) technique. However they are also used as a film for applying a stress in SMT (Stress Memorization Technique).

Further, as the terms noted above, "nickel silicide" used herein means nickel mono-silicide usually, however it is not relatively pure nickel silicide, and includes an alloy and a mixed crystal, both including nickel mono-silicide as its chief constituent. In addition, "silicide" may not be necessarily nickel silicide, and it may be cobalt silicide, titanium silicide, tungsten silicide, and the like which have been used in the past. Aside from Ni (nickel) film, a nickel alloy film, such as a Ni—Pt alloy film (i.e. a film made of alloy of Ni and Pt), Ni—V alloy film (i.e. a film of alloy of Ni and V), a Ni—Pd alloy film (i.e. a film made of alloy of Ni and Pd), a Ni—Yb alloy film (i.e. film of alloy of Ni and Yb), or a Ni—Er alloy film (i.e. a film of alloy of Ni and Er) may be used as a metal film for silicide formation. Now, these kinds of silicide including nickel as a chief metal element thereof shall be referred to as "nickel-based silicide" generically herein.

3. Likewise, preferred examples are herein shown concerning graphic forms, positions, attributes, etc. However, it is obvious that the invention is not limited to the examples technically except when a different matter is particularly and clearly described and when that is apparently denied from the context.

4. Further, in the case that reference is made to a certain numerical value or a certain numerical quantity, what is referred to there may be a value over the certain numerical value or quantity, or a value under the certain numerical value or quantity except when a different matter is particularly and clearly described, when the numerical value and quantity of interest are so limited theoretically, and when that is apparently denied from the context.

5. The term "wafer" used herein represents a monocrystalline silicon wafer on which a semiconductor integrated circuit device (including a semiconductor device and an electronic device) is to be formed usually. However, it is obvious that the "wafer" includes an epitaxial wafer, an SOT substrate, an insulative substrate such as LCD glass substrate, and a composite wafer including a semiconductor layer and the like.

6. In classification of CMIS integrated circuits' manufacturing methods herein, "gate-last method" refers to a method in which a polycrystalline silicon dummy gate electrode is removed after a high-temperature thermal treatment of a source and a drain, and other methods are termed "gate-first method". Now, it is noted that the terms "gate electrode" used herein refers to an actual gate electrode (i.e. a gate electrode which is not a replaced gate electrode nor a dummy gate) and/or a dummy gate electrode as the case may be. The term "a gate electrode height" refers to the height of a gate electrode including a silicide layer if the gate electrode has the silicide layer.

Details of the Embodiments

The details of the embodiments will be described further. In the drawings, like or similar parts or components are identified by the same or similar symbol or reference numeral, and the iteration of description shall be avoided as a rule.

Further, in regard to the accompanying drawings, the hatching and the other decorations may be omitted even with a cross section as long as they would complicate the drawing concerned or the part or component can be clearly identified from a vacant space. In this connection, the background border line may be omitted even with a hole closed in two dimensions as long as it is apparent from the description or the like. Further, even if it is not a cross section, the hatching may be added to clearly show that it is not a vacant space.

Incidentally, the material of a gate electrode of SOI-MISFET is a kind of material having a work function corresponding to a mid-gap. Examples of the patent applications concerning the prior art which disclose a technique for providing an impurity region for threshold voltage adjustment in a back gate region of SOI-MISFET include Japanese Patent Applications No. 2010-277992 (filed on Dec. 4, 2010 in Japan) and No. 2010-277993 (filed on Dec. 4, 2010 in Japan).

1. Description of a device structure (i.e. a constant-elevation substrate top face type device) associated with an example of the semiconductor integrated circuit device according to one embodiment Here, Reference is made to FIG. 1 chiefly.

The specific description is presented below concerning the device structure while taking a technology node of 65 nm as an example. Shown in the drawing are structures of the device and others almost at the end of FEOL process (namely before the contact process) is shown for the sake of concise description. The BEOL process is described herein assuming e.g. several to more than ten layers of copper-based buried wiring and an aluminum-based pad layer. However, it is obvious that another kind of buried wiring, a different pad layer, another kind of aluminum-based non-buried wiring, and the like may be adopted.

The examples of the characteristics and others of MISFET which will be described below are as follows. The gate length of an SOI type MISFET is e.g. 65 nm approximately, and that of a bulk type MISFET is e.g. 160 nm approximately.

FIG. 1 is a device sectional view for explaining a device structure (i.e. a constant-elevation substrate top face type device) associated with an example of the semiconductor integrated circuit device of one embodiment of the present application. With referent to the drawing, the device structure (i.e. a constant-elevation substrate top face type device) associated with the example of the semiconductor integrated circuit device of the embodiment will be described.

As shown in FIG. 1, the chief device structure is formed on e.g. the side of the device plane 1a (first principal plane) of the P type monocrystalline silicon semiconductor substrate 1s, i.e. the side opposite to the rear face 1b (second principal plane). The plane region (chip region) of the semiconductor chip 2 is divided into an SOI type MISFET formation region Rs where an SOI type device is formed, and a bulk type MISFET formation region Rb where a bulk type device is formed. The SOI type MISFET formation region Rs is divided into an SOI type N-channel MISFET formation region (first MISFET formation region) Rsn where an SOI type N-channel MISFET (Qsn), i.e. a first MISFET, and the like are formed, and an SOI type 2-channel MISFET formation region (third MISFET formation region) Rsp where an SOI type P-channel MISFET (Qsp), i.e. a third MISFET, and the like are formed. On the other hand, the bulk type MISFET formation region Rb is divided into a bulk type N-channel MISFET formation region (second MISFET formation region) Rbn where a bulk type N-channel MISFET (Qbn), i.e. a second MISFET, and the like are formed, and a bulk type P-channel MISFET formation region Rbp where a bulk type P-channel MISFET (Qbp) and the like are formed.

On the side of the device plane 1a of the semiconductor substrate 1s, STI (Shallow Trench Isolation) insulative films 4 (device isolation regions) are provided, which separate the SOI type N-channel MISFET formation region Rsn, the SOI type P-channel MISFET formation region Rsp, the bulk type N-channel MISFET formation region Rbn, and the bulk type P-channel MISFET formation region Rbp from each other.

An SOI type N-channel MISFET well region 5 is provided on a surface region of the device plane 1a of the semiconductor substrate 1s in the SOI type N-channel MISFET formation region Rsn, and an SOI type P-channel MISFET well region 6 is provided on a surface region of the device plane 1a of the semiconductor substrate 1s in the SOI type P-channel MISFET formation region Rsp.

A bulk type N-channel MISFET well region 7 is provided on a surface region of the device plane 1a of the semiconductor substrate 1s in the bulk type N-channel MISFET formation region Rbn, and a bulk type P-channel MISFET well region 8 is provided on a surface region of the device plane 1a of the semiconductor substrate 1s in the bulk type P-channel MISFET formation region Rbp.

A BOX insulator layer 32 or an buried oxide film layer (also referred to as "BOX layer" or "buried insulator layer") is formed on a surface of the device plane 1a of the semiconductor substrate 1s in the SOI type MISFET formation region Rs. An SOI silicon semiconductor layer 3 (also referred to as "SOI layer" or "semiconductor-on-insulator layer") is formed on the BOX insulator layer 32. Incidentally, in this example, the surface of the device plane 1a of the semiconductor substrate 1s in the SOI type MISFET formation region Rs, and the surface of the device plane 1a of the semiconductor substrate 1s in the bulk type MISFET formation region Rb are substantially in the same plane. That is, these surfaces are substantially at the same elevation. In this example, the thickness of the BOX insulator layer 32 is e.g. about 10 nm, whereas the upper limit of the thickness is preferably e.g. about 15 nm. In other words, about a quarter of the channel length of SOI type MISFET or a smaller value is a preferable upper limit. In addition, the BOX insulator layer 32 is arranged to have a thickness which allows the N type well region 5 and the P type well region 6, which are to be described later, to serve as back gates.

Further, in this example, the thickness of the SOI layer 3 is e.g. about 15 nm, whereas the upper limit of the thickness is preferably e.g. about 20 nm. As described above, the thickness of the SOI layer 3 is far smaller than e.g. the thickness of the gate electrode of MISFET of the bulk region.

In the SOI silicon semiconductor layer 3 in the SOI type N-channel MISFET formation region Rsn, an N type extension region 17 of an SOI type N-channel MISFET (Qbn) is provided. In the SOI silicon semiconductor layer 3 in the SOI type P-channel MISFET formation region Rsp, a P type extension region 18 of an SOI type P-channel MISFET (Qsp) is provided.

In addition, the N type well region 5 is formed in the semiconductor substrate 1s under the BOX insulator layer 32 of the SOI type N-channel MISFET formation region Rsn. The N type well region 5 works as a back gate of the SOI type N-channel MISFET. Specifically, the threshold of the SOI type N-channel MISFET can be adjusted by applying a predetermined voltage to the N type well region 5. The P type well region 6 is formed in the semiconductor substrate 1s under the BOX insulator layer 32 of the SOI type P-channel MISFET formation region Rsp. The P type well region 6 works as the N type well region 5 does, and serves as a back gate of the SOI type P-channel MISFET.

In the surface region of the bulk type N-channel MISFET well region 7, an N type LDD region 15 of the bulk type N-channel MISFET (Qbn) is provided, provided that LDD stands for "Lightly Doped Drain"; in the surface region of the bulk type P-channel MISFET well region 8, a P type LDD region 16 of the bulk type P-channel MISFET (Qbp) is provided.

On the N type extension region 17, N+ type source and drain regions 20 of the SOI type N-channel MISFET (Qbn) is provided; on the P type extension region 18, P+ type source and drain regions 21 of the SOI type P-channel MISFET (Qsp) is provided. Further, a silicide film 26 (e.g. a nickel-based silicide film) is formed on each of the N+ type source and drain regions 20 and the P+ type source and drain regions 21. Now, it is noted that although the N+ type source and drain regions 20 and the P+ type source and drain regions 21 each serving as an impurity-doped region extend to the N type extension region 17 and the P type extension region 18 as shown by broken lines, the N+ and P+ type source and drain regions shall be drawn only in the view of a finished device. This is because the drawings are complicated by showing the extensions in all the drawings. This rule shall apply to the N+ type source and drain regions 20 and the P+ type source and drain regions 21, which will be described below.

Likewise, the N+ type source and drain regions 20 of the bulk type N-channel MISFET (Qbn) is provided on the N type LDD region 15; the P+ type source and drain regions 21 of the bulk type P-channel MISFET (Qbp) is provided on the P type LDD region 16. Incidentally, the silicide film 26 (e.g. a nickel-based silicide film) is formed on each of the N+ type source and drain regions 20 and the P+ type source and drain regions 21.

Between the N+ type source and drain regions 20 on the SOI silicon semiconductor layer 3 in the SOI type N-channel MISFET formation region Rsn, a gate stack structure of the SOI type N-channel MISFET (Qsn) is provided with sidewall spacers 19 interposed between the gate stack structure and the N+ type source and drain regions 20. The gate stack structure includes, from the undermost position in turn: an SOI region gate insulative film 10 (first gate insulative film) such as a silicon dioxide film-based interface insulative film; a high-permittivity gate insulative film 23; a metal gate electrode film 24; and a gate-charged conductive film 25. As to the gate electrode, the gate electrode 13 (first gate electrode) of the N-channel MISFET (Qsn), namely the actual gate electrode 13r thereof includes a metal gate electrode film 24 and a gate-charged conductive film 25.

A specific material of the high-permittivity gate insulative film 23 is preferably a hafnium oxide-based High-k gate insulative film (HfON and HfO) including a HfSiON film, for example.

Likewise, between the P+ type source and drain regions 21 on the SOI silicon semiconductor layer 3 in the SOI type P-channel MISFET formation region Rsp, a gate stack structure of the SOI type P-channel MISFET (Qsp) is provided with sidewall spacers 19 interposed between the gate stack structure and the P+ type source and drain regions 21. The gate stack structure includes, from the undermost position in turn: an SOI region gate insulative film 10 (first gate insulative film) such as a silicon dioxide film-based interface insulative film; a high-permittivity gate insulative film 23; a metal gate electrode film 24; and a gate-charged conductive film 25. As to the gate electrode, the gate electrode 14 (second gate electrode) of the P-channel MISFET (Qsp), namely the actual gate electrode 14r includes the metal gate electrode film 24 and the gate-charged conductive film 25. Incidentally, the gate electrode composed of a combination of the metal gate electrode film 24 and the gate-charged conductive film 25 has a thickness of about 150 nm, for example.

Further, between the N+ type source and drain regions 20 on the device plane 1a of the semiconductor substrate 1s of in the bulk type N-channel MISFET (Qbn), a gate stack structure of the bulk type N-channel MISFET (Qbn) is provided with the sidewall spacers 19 interposed between the gate stack structure and the N+ type source and drain regions 20. The gate stack structure includes, from the undermost position in turn for example: a bulk region gate insulative film 9 such as a silicon dioxide film-based gate insulative film; a gate electrode 33 (second gate electrode) of the bulk type N-channel MISFET such as a polycrystalline silicon gate electrode; and a silicide film 26 (e.g. a nickel-based silicide film). Incidentally, the gate electrode composed of a combination of the gate electrode 33 and the silicide film 26 has a thickness of about 100 nm, for instance. In this example, the top face 1a of the semiconductor substrate 1s in the bulk region and the top face 1a (the lower face of the BOX layer 32) of the semiconductor substrate 1s in the SOI region are located substantially at the same height, and therefore the top face of the gate electrode of MISFET in the SOI region is higher in height than the gate electrode of MISFET in the bulk region by a difference in height between the gate electrodes, and the like. This structure is advantageous in that a processing such as arranging the SOI region and the bulk region so that they are different from each other in MISFET gate stack structure can be made easier. In the case of this example, the gate stack structure of MISFET in the SOI region is a replaced gate structure, i.e. a replacement gate structure. On the other hand, the gate stack structure of MISFET of in the bulk region is a usual structure (which is not a replacement gate structure).

Further, an interlayer insulative film 22 having a silicon oxide-based insulative film as a chief constituent is formed to cover the side of the device plane 1a of the semiconductor chip 2 almost overall.

As described above, the height of the first gate electrode 13 with respect to the first principal plane 1a of the semiconductor substrate 1s is arranged to be higher than that of the second gate electrode 14.

2. Description of the double-layer polycrystalline silicon process as an example of a manufacturing method for a semiconductor integrated circuit device arranged for the device structure according to the embodiment (See FIGS. 2 to 17 chiefly.)

The SOI gate-last & bulk gate-first process on a double-layer polycrystalline silicon dummy gate structure will be described as an example of a manufacturing method of the device structure described in the section 1 specifically in this section. For the control of the threshold voltage of an SOI type MISFET, a mid-gap single metal & single High-k method is adopted. However, a single-layer polycrystalline silicon dummy gate structure may be adopted instead of the double-layer polycrystalline silicon dummy gate structure as described in the sections 3 and 4. Further, a dual metal (Dual Metal) method by which metals having different work functions are used on the side of N-channel type (e.g. TiN) and the side of P-channel type (e.g. TaN) respectively may be adopted instead of the mid-gap single metal & single High-k method.

Figure 2:
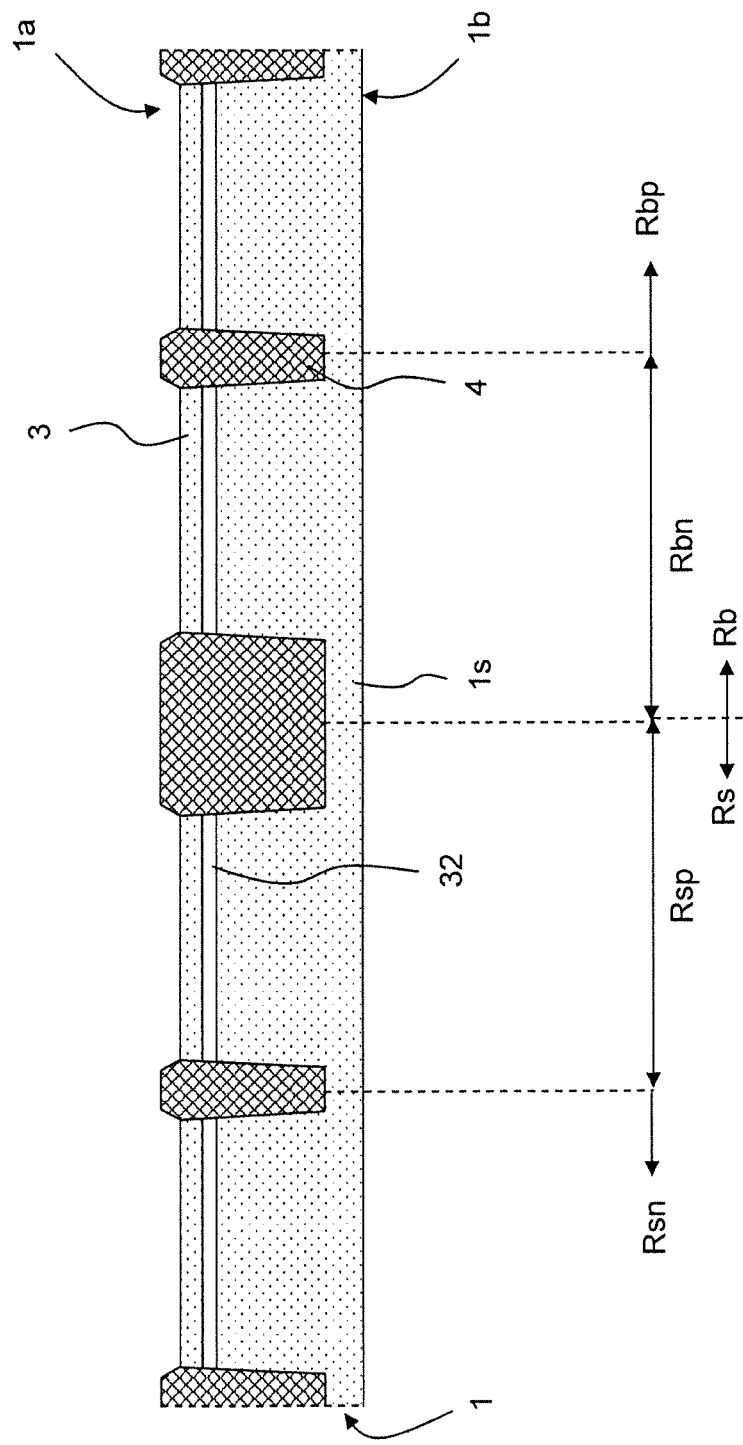
FIG. 2 is a device sectional view for explaining an example (i.e. a double-layer polycrystalline silicon process) of a manufacturing method for a semiconductor integrated circuit device arranged for the device structure according to the embodiment, which shows the device of FIG. 1 in course of a wafer process (specifically, a device isolation region forming process)
Figure 3:
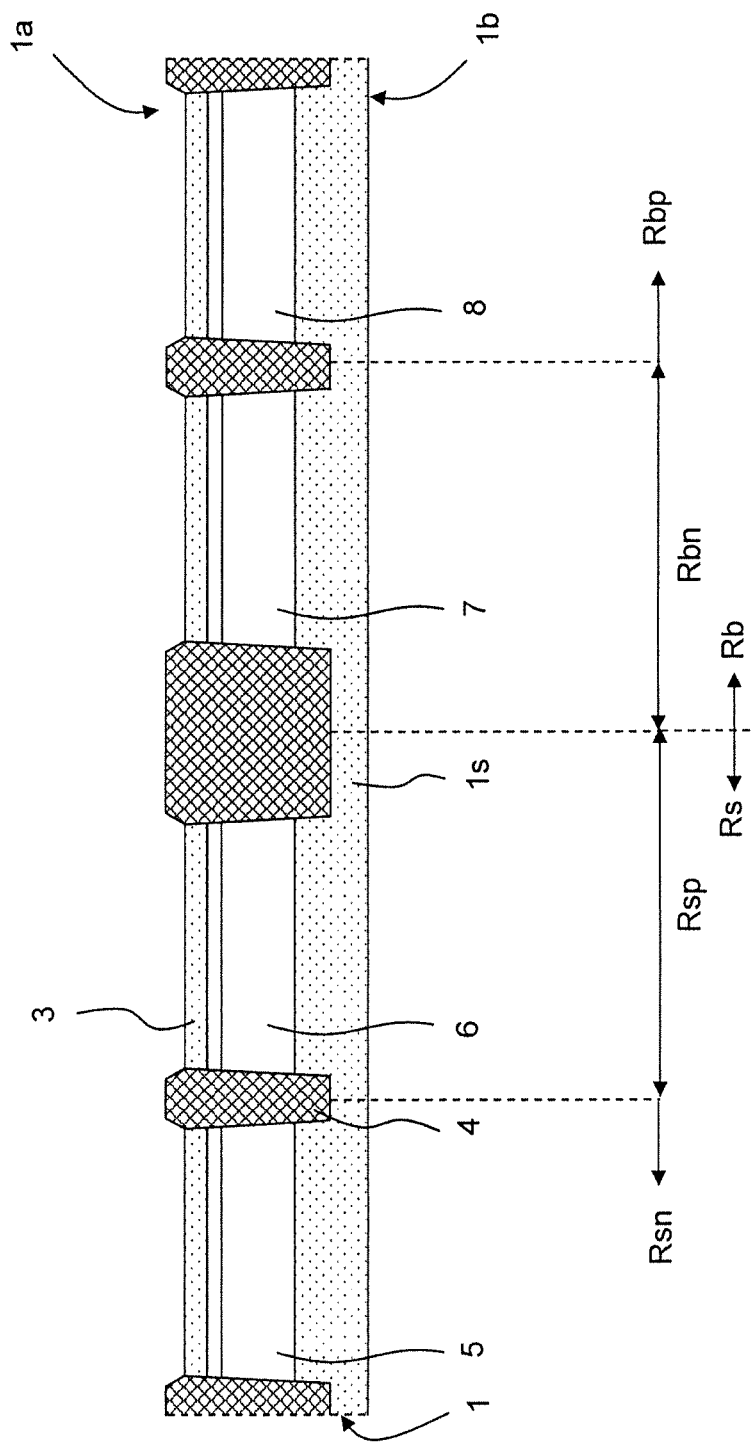
FIG. 3 is a device sectional view for explaining the example (i.e. the double-layer polycrystalline silicon process) of the manufacturing method for a semiconductor integrated circuit device arranged for the device structure of the embodiment, which shows the device of FIG. 1 in course of a wafer process (specifically, a well-forming process)
Figure 4:
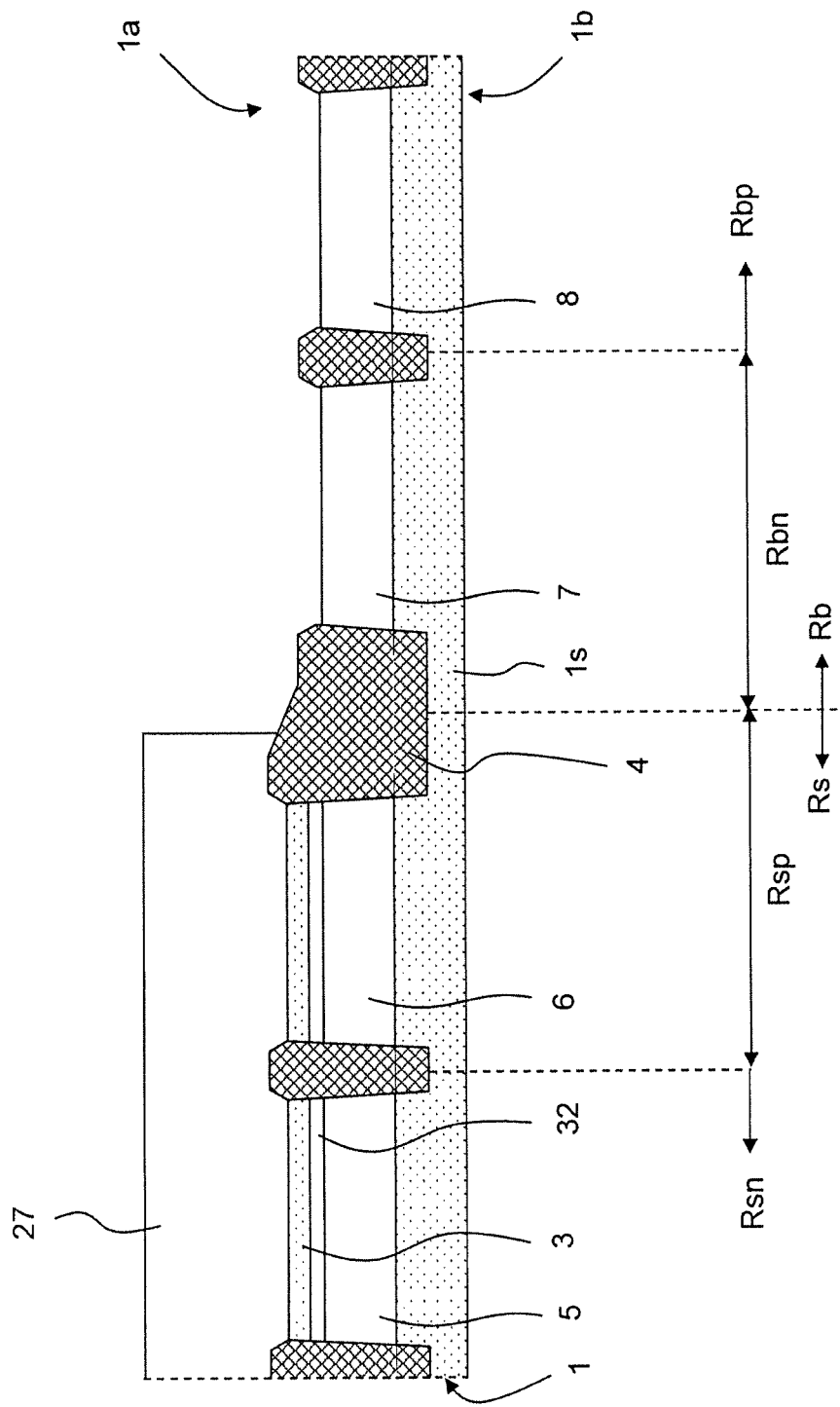
FIG. 4 is a device sectional view for explaining the example (i.e. double-layer polycrystalline silicon process) of the manufacturing method for a semiconductor integrated circuit device arranged for the device structure according to the embodiment, which shows the device of FIG. 1 in course of a wafer process (specifically, a bulk region substrate surface exposure process)
Figure 5:
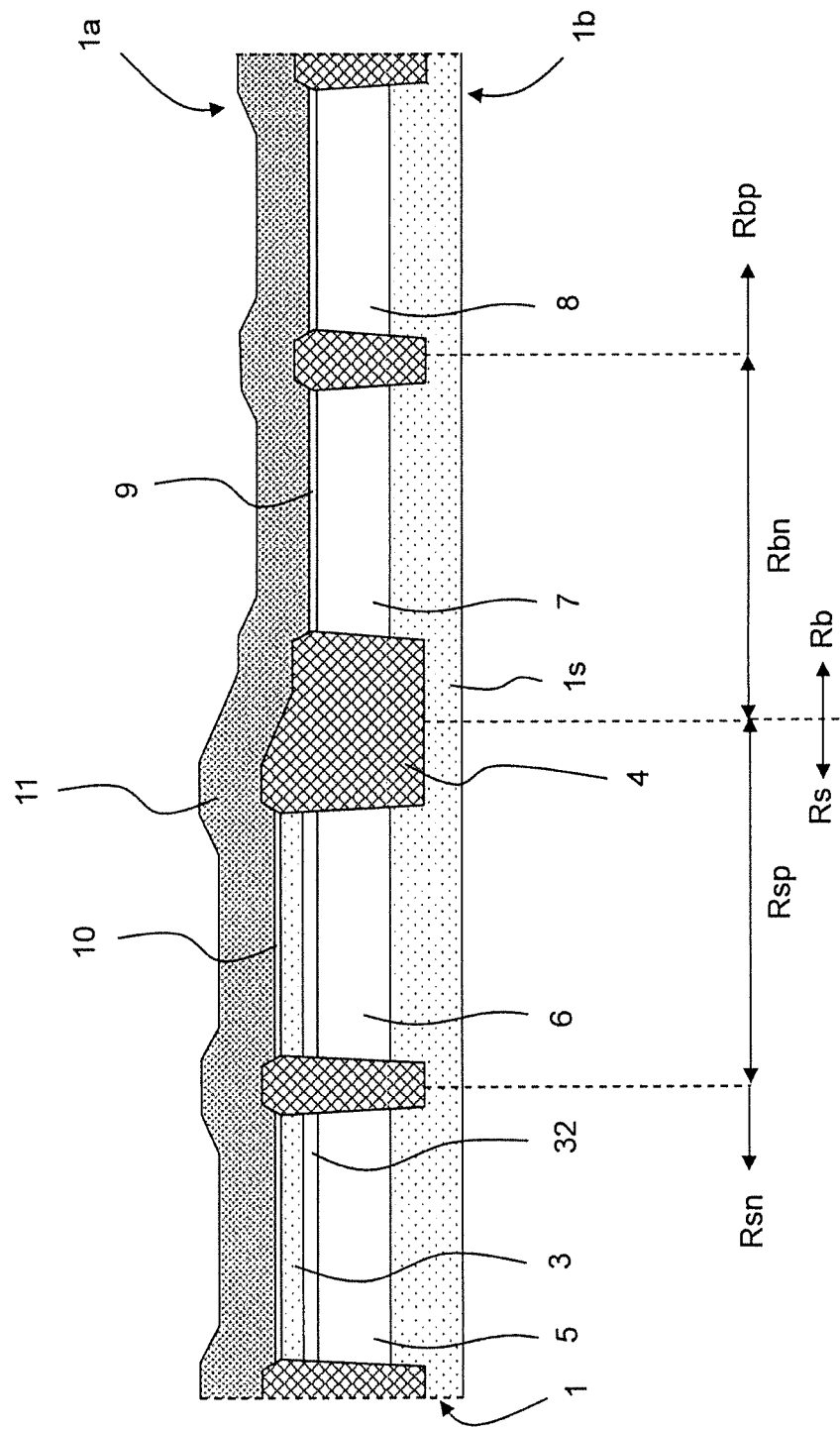
FIG. 5 is a device sectional view for explaining the example (i.e. double-layer polycrystalline silicon process) of the manufacturing method for a semiconductor integrated circuit device arranged for the device structure of the embodiment, which shows the device of FIG. 1 in course of a wafer process (specifically, a first-layer polycrystalline silicon film forming process)
Figure 6:
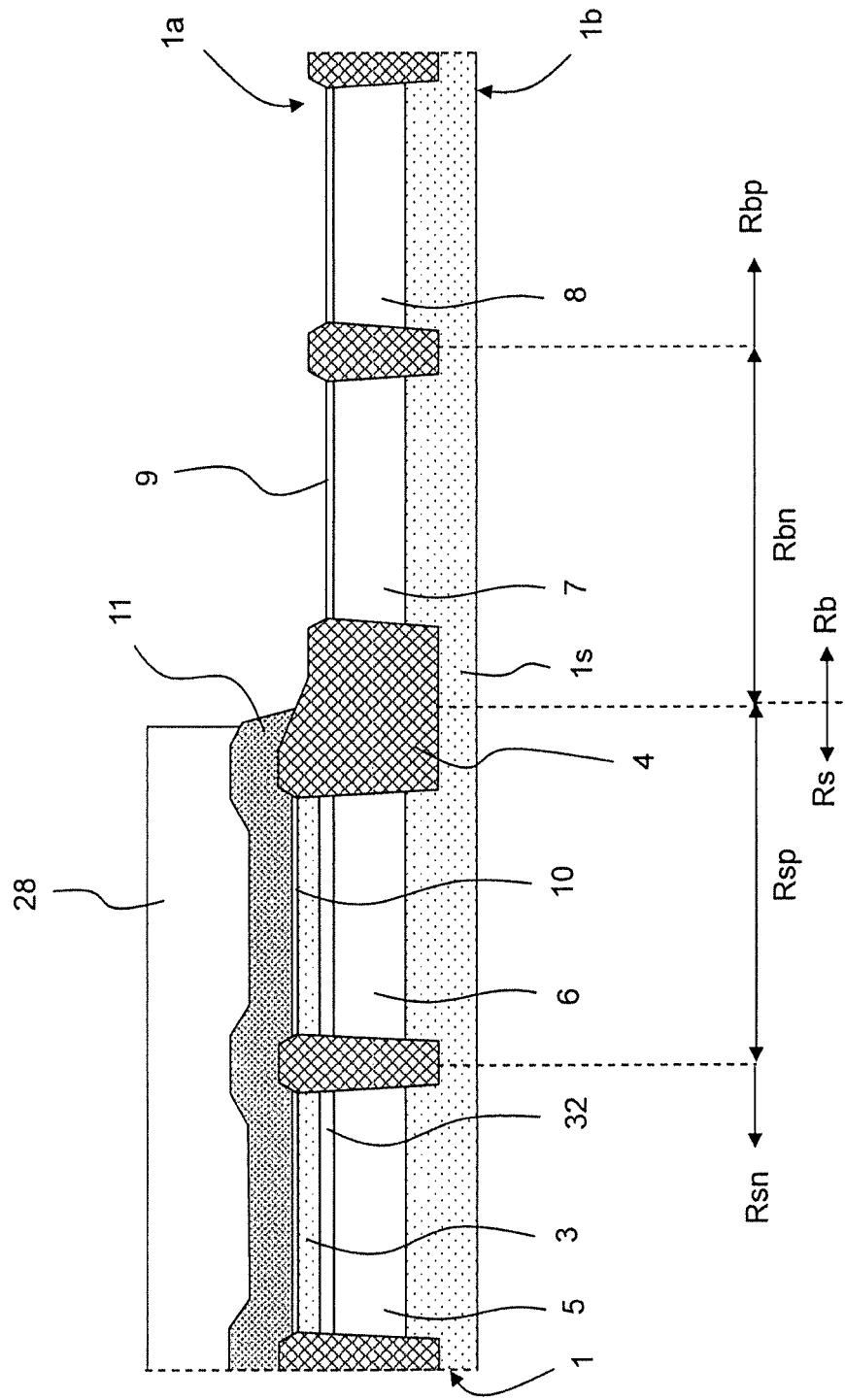
FIG. 6 is a device sectional view for explaining the example (i.e. double-layer polycrystalline silicon process) of the manufacturing method for a semiconductor integrated circuit device arranged for the device structure according to the embodiment, which shows the device of FIG. 1 in course of a wafer process (specifically, a first-layer polycrystalline silicon removing process)
Figure 7:
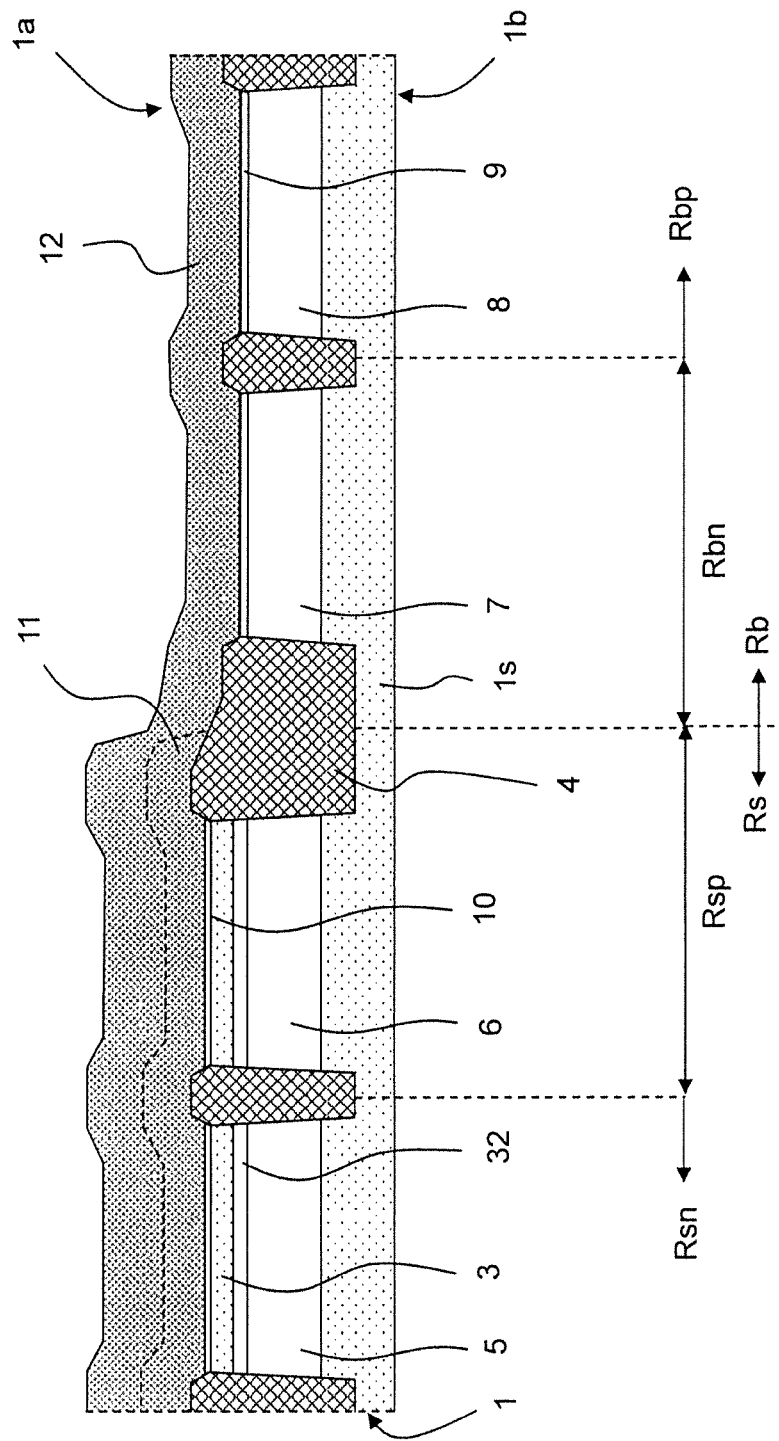
FIG. 7 is a device sectional view for explaining the example (i.e. double-layer polycrystalline silicon process) of the manufacturing method for a semiconductor integrated circuit device arranged for the device structure according to the embodiment, which shows the device of FIG. 1 in course of a wafer process (specifically, a second-layer polycrystalline silicon forming process)
Figure 8:
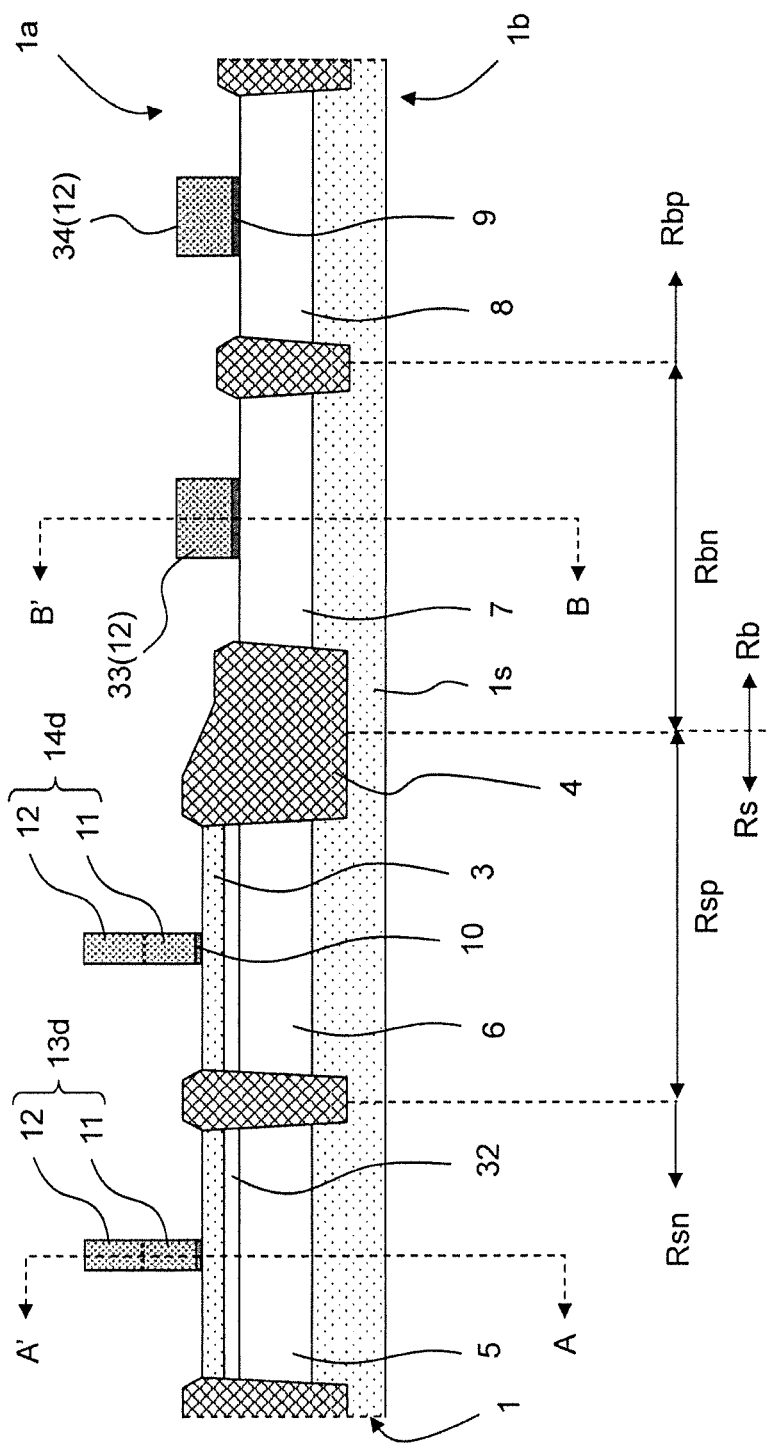
FIG. 8 is a device sectional view for explaining the example (i.e. double-layer polycrystalline silicon process) of the manufacturing method for a semiconductor integrated circuit device arranged for the device structure according to the embodiment, which shows the device of FIG. 1 in course of a wafer process (specifically, a gate machining process)
Figure 9:
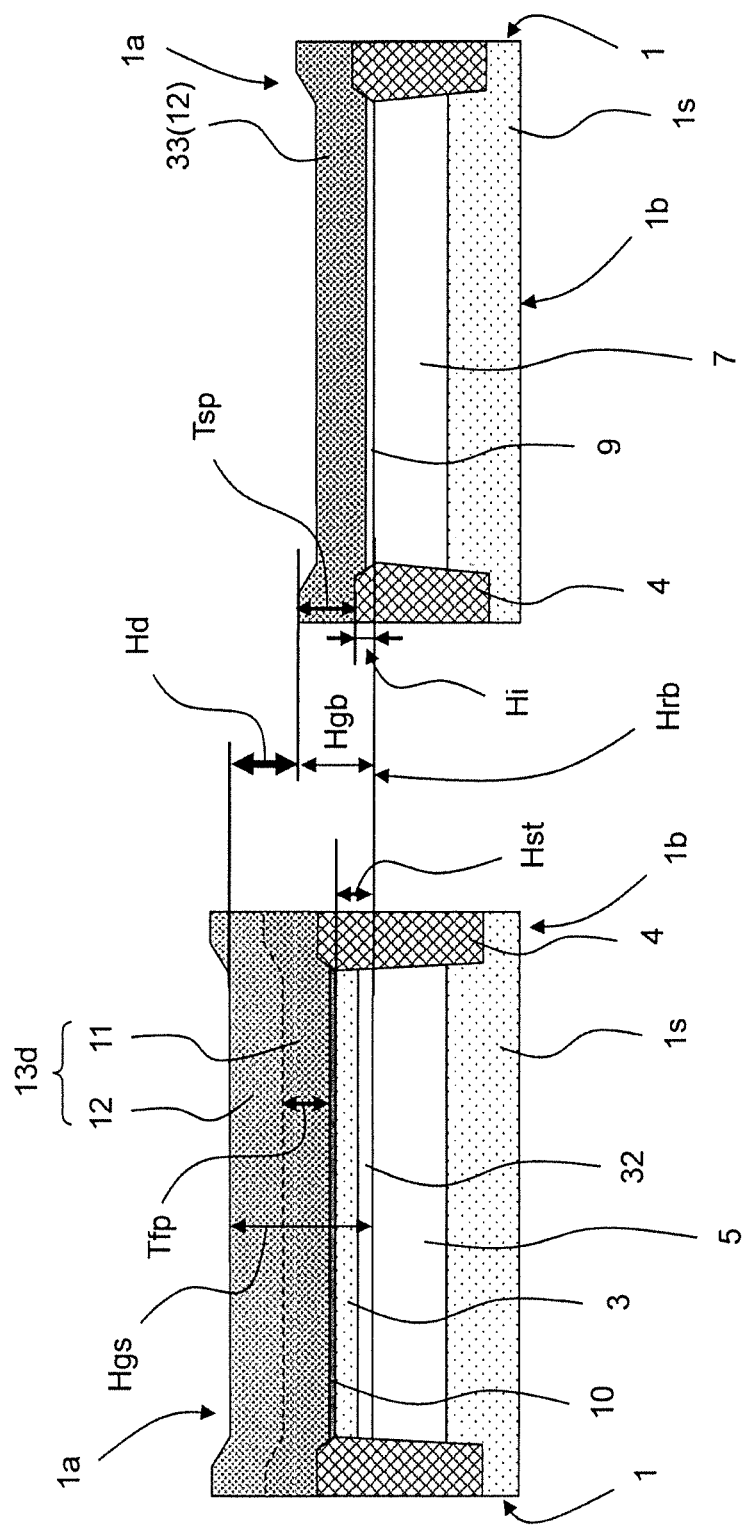
FIG. 9 is an explanatory sectional view for explaining a device cross section taken along the line A-A' in FIG. 8 (shown on the left side) and a device cross section taken along the line B-B' (shown on the right side)
Figure 10:
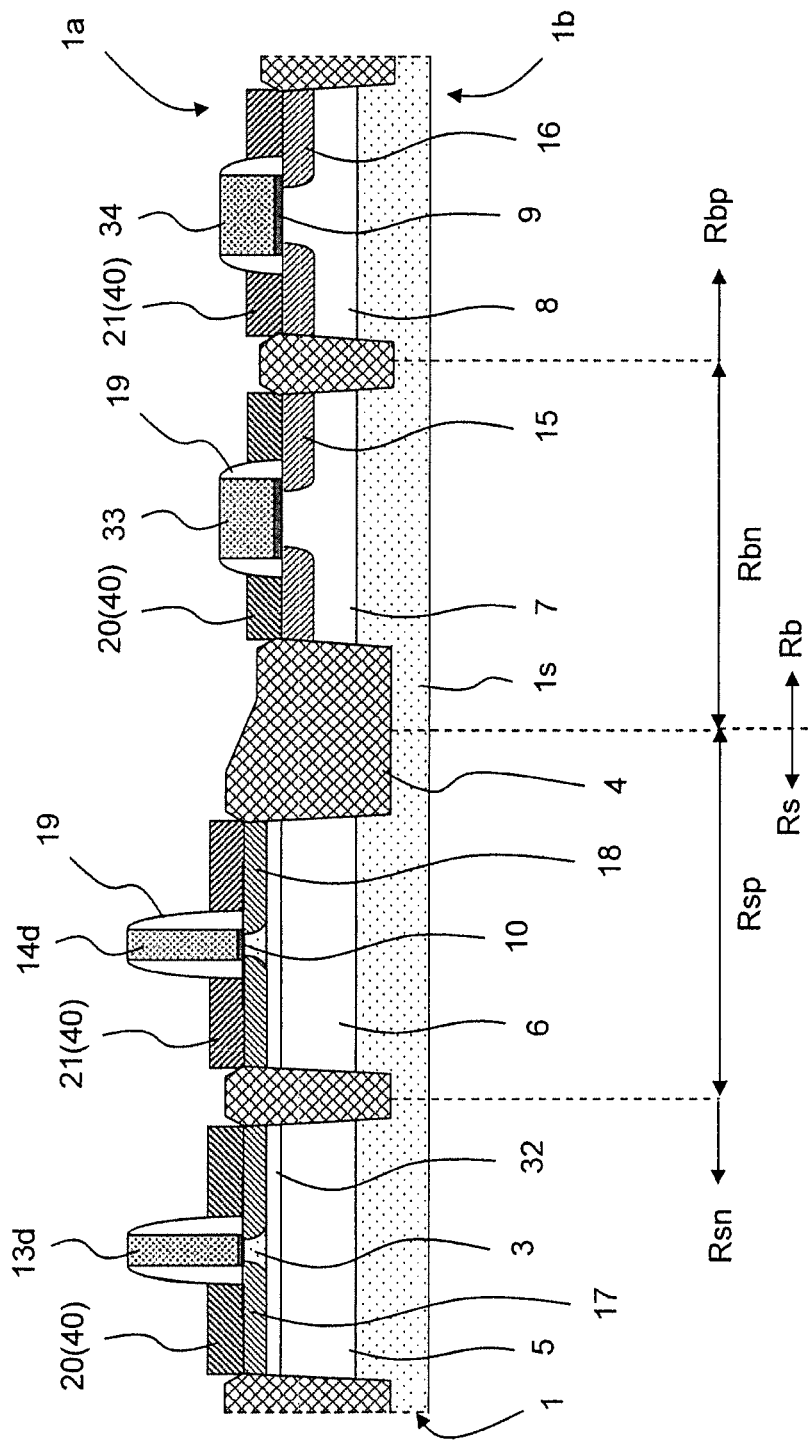
FIG. 10 is a device sectional view for explaining the example (i.e. double-layer polycrystalline silicon process) of the manufacturing method for a semiconductor integrated circuit device arranged for the device structure according to the embodiment, which shows the device of FIG. 1 in course of a wafer process (specifically, a process for forming a gate-surrounding structure, a source, and a drain)
Figure 11:
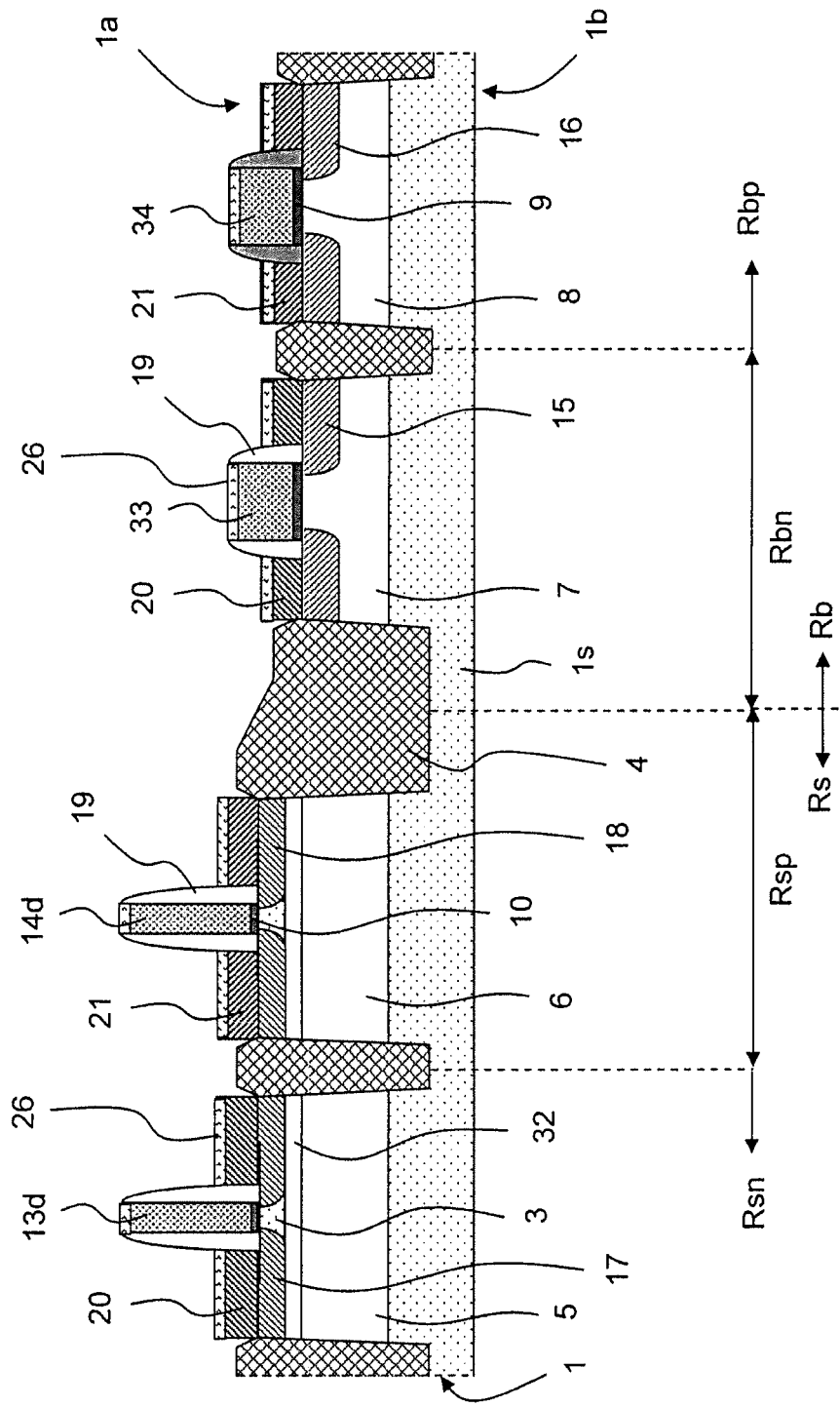
FIG. 11 is a device sectional view for explaining the example i.e. double-layer polycrystalline silicon process of the manufacturing method for a semiconductor integrated circuit device arranged for the device structure according to the embodiment, which shows the device of FIG. 1 in course of a wafer process (specifically, a surface silicification process)
Figure 12:
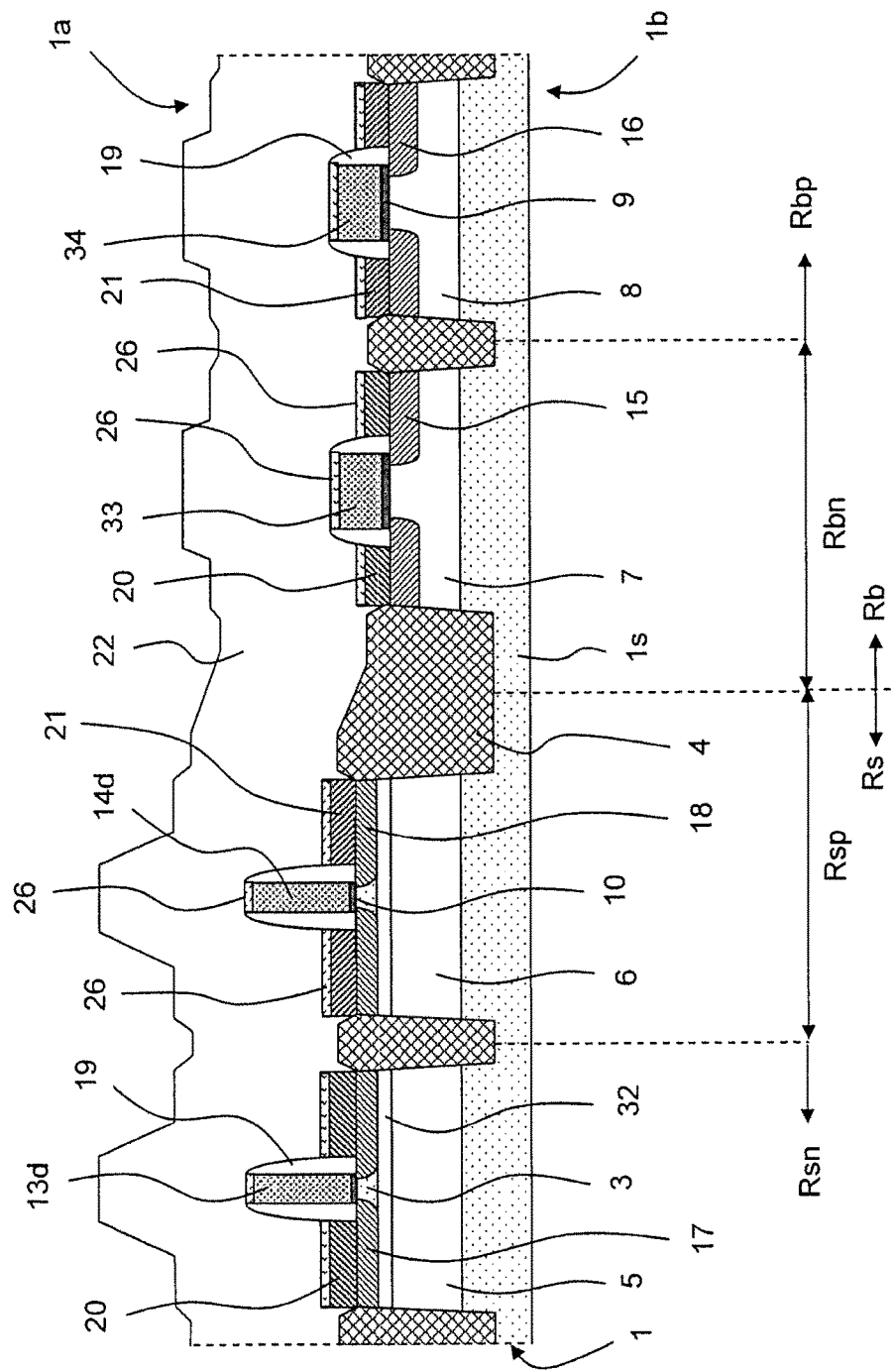
FIG. 12 is a device sectional view for explaining the example (i.e. double-layer polycrystalline silicon process) of the manufacturing method for a semiconductor integrated circuit device arranged for the device structure according to the embodiment, which shows the device of FIG. 1 in course of a wafer process (specifically, an interlayer insulative film forming process)
Figure 13:
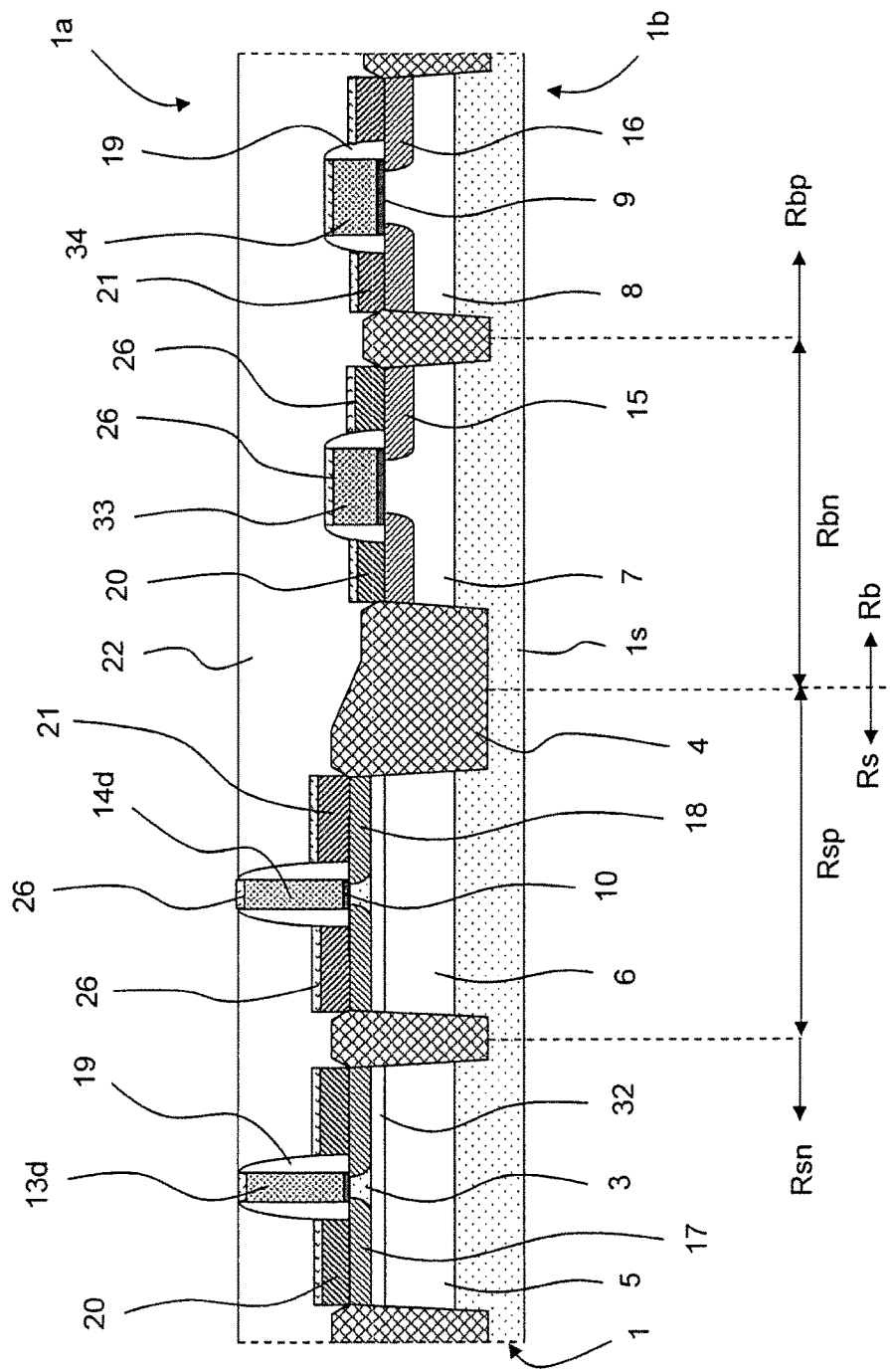
FIG. 13 is a device sectional view for explaining the example (i.e. double-layer polycrystalline silicon process) of the manufacturing method for a semiconductor integrated circuit device arranged for the device structure according to the embodiment, which shows the device of FIG. 1 in course of a wafer process (specifically, a pre-gate-replacement CMP process)
Figure 14:
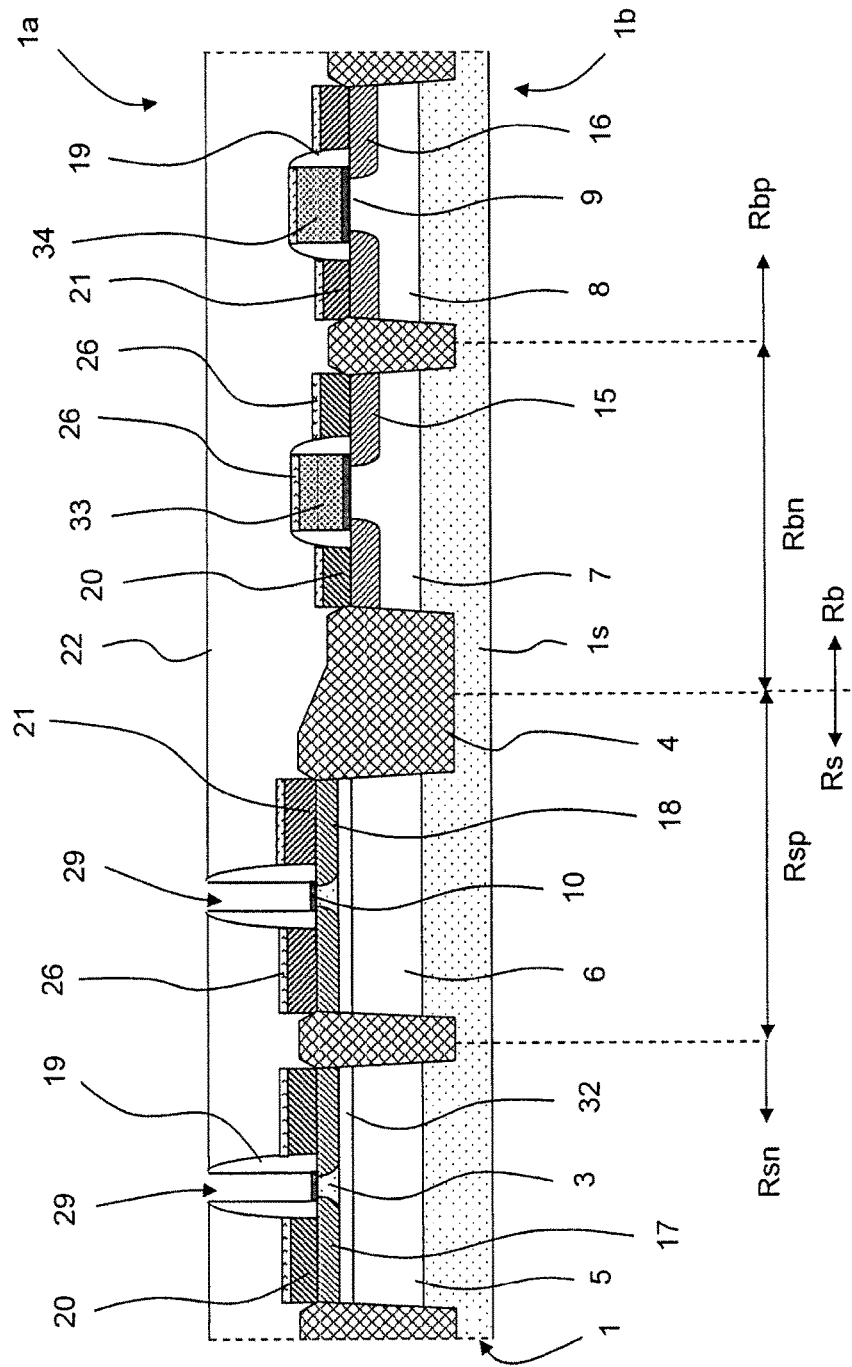
FIG. 14 is a device sectional view for explaining the example (i.e. double-layer polycrystalline silicon process) of the manufacturing method for a semiconductor integrated circuit device arranged for the device structure according to the embodiment, which shows the device of FIG. 1 in course of a wafer process (specifically, a dummy gate removing process)
Figure 15:
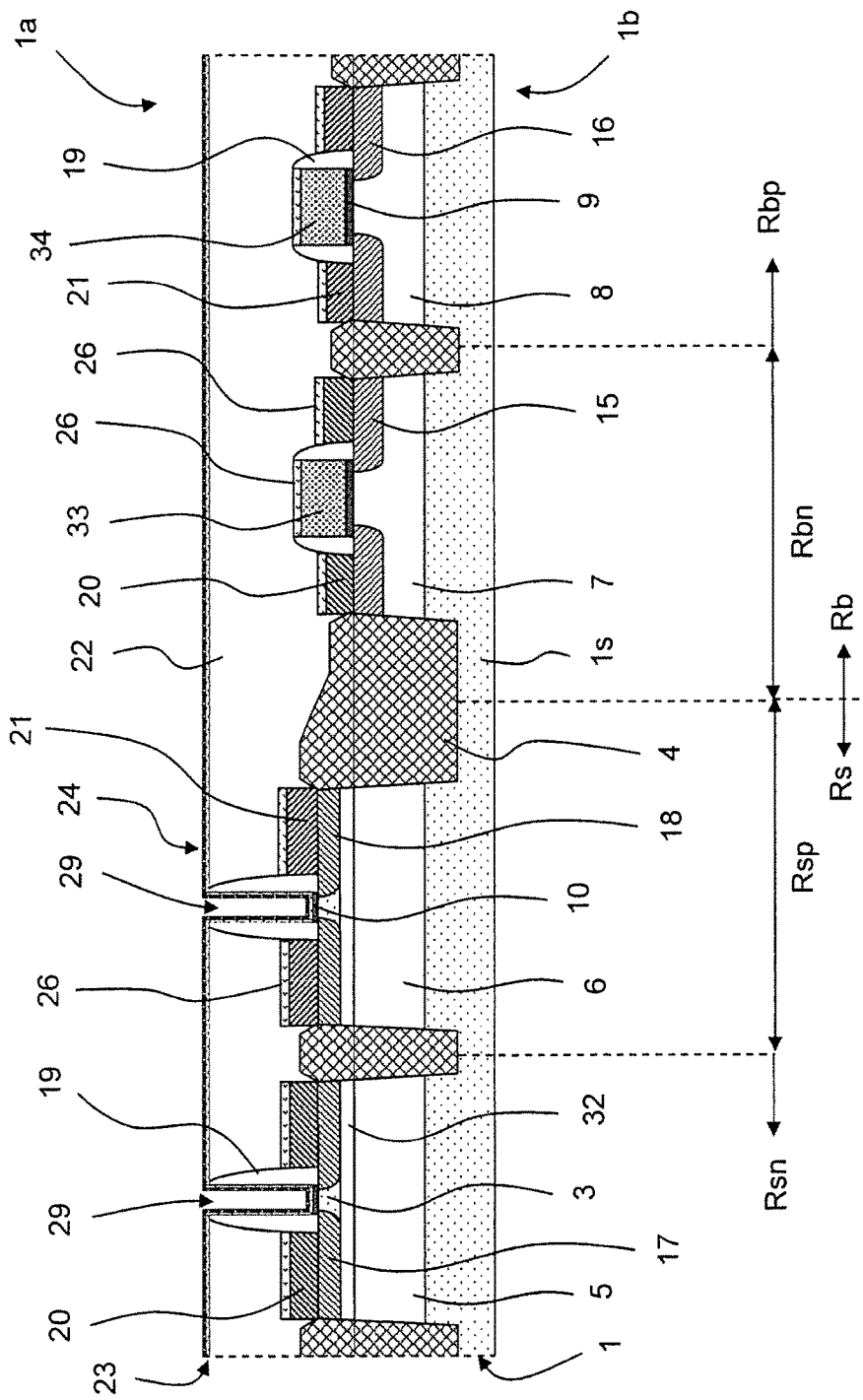
FIG. 15 is a device sectional view for explaining the example (i.e. double-layer polycrystalline silicon process) of the manufacturing method for a semiconductor integrated circuit device arranged for the device structure according to the embodiment, which shows the device of FIG. 1 in course of a wafer process (specifically, a process for forming High-k gate insulative film & metal gate electrode)
Figure 16:
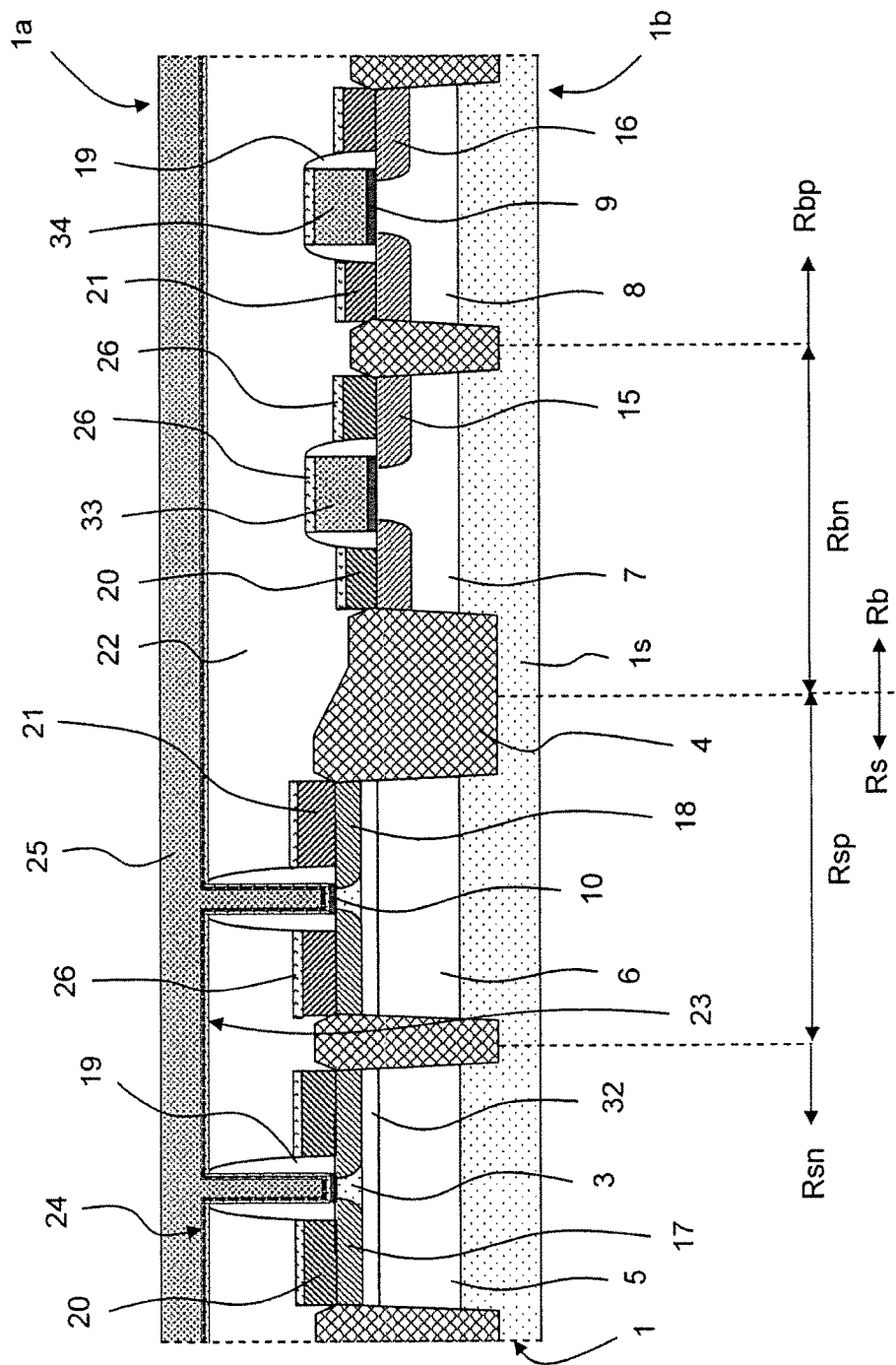
FIG. 16 is a device sectional view for explaining the example (i.e. double-layer polycrystalline silicon process) of the manufacturing method for a semiconductor integrated circuit device arranged for the device structure according to the embodiment, which shows the device of FIG. 1 in course of a wafer process (specifically, a gate charging process)
Figure 17:
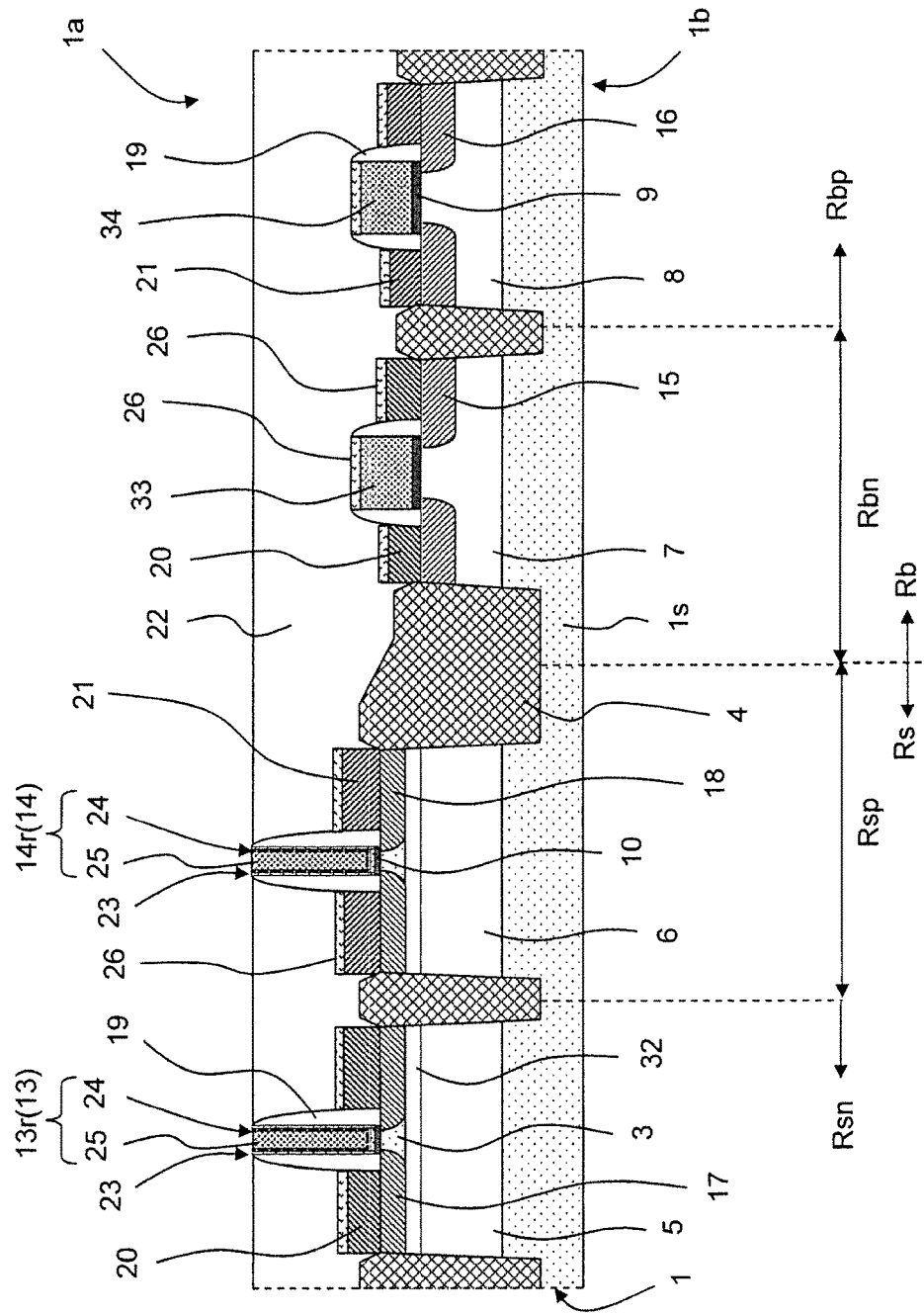
FIG. 17 is a device sectional view for explaining the example (i.e. double-layer polycrystalline silicon process) of the manufacturing method for a semiconductor integrated circuit device arranged for the device structure according to the embodiment, which shows the device of FIG. 1 in course of a wafer process (specifically, a post-gate-replacement CMP process)

FIG. 2 is a device sectional view for explaining an example (i.e. a double-layer polycrystalline silicon process) of a manufacturing method for a semiconductor integrated circuit device arranged for the device structure according to the embodiment, which shows the device of FIG. 1 in course of the wafer process (specifically, device isolation region forming process). FIG. 3 is a device sectional view for explaining the example (i.e. the double-layer polycrystalline silicon process) of the manufacturing method for a semiconductor integrated circuit device arranged for the device structure of the embodiment, which shows the device of FIG. 1 in course of a wafer process (specifically, a well-forming process). FIG. 4 is a device sectional view for explaining the example (i.e. double-layer polycrystalline silicon process) of the manufacturing method for a semiconductor integrated circuit device arranged for the device structure according to the embodiment, which shows the device of FIG. 1 in course of a wafer process (specifically, a bulk region substrate surface exposure process). FIG. 5 is a device sectional view for explaining the example (i.e. double-layer polycrystalline silicon process) of the manufacturing method for a semiconductor integrated circuit device arranged for the device structure of the embodiment, which shows the device of FIG. 1 in course of a wafer process (specifically, a first-layer polycrystalline silicon film forming process). FIG. 6 is a device sectional view for explaining the example (i.e. double-layer polycrystalline silicon process) of the manufacturing method for a semiconductor integrated circuit device arranged for the device structure according to the embodiment, which shows the device of FIG. 1 in course of a wafer process (specifically, a first-layer polycrystalline silicon removing process). FIG. 7 is a device sectional view for explaining the example (i.e. double-layer polycrystalline silicon process) of the manufacturing method for a semiconductor integrated circuit device arranged for the device structure according to the embodiment, which shows the device of FIG. 1 in course of a wafer process (specifically, a second-layer polycrystalline silicon forming process). FIG. 8 is a device sectional view for explaining the example (i.e. double-layer polycrystalline silicon process) of the manufacturing method for a semiconductor integrated circuit device arranged for the device structure according to the embodiment, which shows the device of FIG. 1 in course of a wafer process (specifically, a gate machining process). FIG. 9 is an explanatory sectional view for explaining a device cross section taken along the line A-A' in FIG. 8 (shown on the left side) and a device cross section taken along the line B-B' (shown on the right side). FIG. 10 is a device sectional view for explaining the example (i.e. double-layer polycrystalline silicon process) of the manufacturing method for a semiconductor integrated circuit device arranged for the device structure according to the embodiment, which shows the device of FIG. 1 in course of a wafer process (specifically, a process for forming a gate-surrounding structure, a source, and a drain). FIG. 11 is a device sectional view for explaining the example (i.e. double-layer polycrystalline silicon process) of the manufacturing method for a semiconductor integrated circuit device arranged for the device structure according to the embodiment, which shows the device of FIG. 1 in course of a wafer process (specifically, a surface silicification process). FIG. 12 is a device sectional view for explaining the example (i.e. double-layer polycrystalline silicon process) of the manufacturing method for a semiconductor integrated circuit device arranged for the device structure according to the embodiment, which shows the device of FIG. 1 in course of a wafer process (specifically, an interlayer insulative film forming process). FIG. 13 is a device sectional view for explaining the example (i.e. double-layer polycrystalline silicon process) of the manufacturing method for a semiconductor integrated circuit device arranged for the device structure according to the embodiment, which shows the device of FIG. 1 in course of a wafer process (specifically, a pre-gate-replacement CMP process). FIG. 14 is a device sectional view for explaining the example (i.e. double-layer polycrystalline silicon process) of the manufacturing method for a semiconductor integrated circuit device arranged for the device structure according to the embodiment, which shows the device of FIG. 1 in course of a wafer process (specifically, a dummy gate removing process). FIG. 15 is a device sectional view for explaining the example (i.e. double-layer polycrystalline silicon process) of the manufacturing method for a semiconductor integrated circuit device arranged for the device structure according to the embodiment, which shows the device of FIG. 1 in course of a wafer process (specifically, a process for forming High-k gate insulative film & metal gate electrode). FIG. 16 is a device sectional view for explaining the example (i.e. double-layer polycrystalline silicon process) of the manufacturing method for a semiconductor integrated circuit device arranged for the device structure according to the embodiment, which shows the device of FIG. 1 in course of a wafer process (specifically, a gate charging process). FIG. 17 is a device sectional view for explaining the example (i.e. double-layer polycrystalline silicon process) of the manufacturing method for a semiconductor integrated circuit device arranged for the device structure according to the embodiment, which shows the device of FIG. 1 in course of a wafer process (specifically, a post-gate-replacement CMP process). With reference to the drawings, the example (i.e. double-layer polycrystalline silicon process) of the manufacturing method for a semiconductor integrated circuit device arranged for the device structure according to the embodiment will be described.

First, e.g. a P type monocrystalline silicon semiconductor wafer 1s having an buried insulator layer 32 over an almost entire surface on the side of its device plane 1a (i.e. the first principal plane), and a semiconductor layer 3 on the insulator layer is prepared, which is herein referred to as "SOI wafer" (see FIG. 2). The wafer has a wafer size of e.g. about 300Φ, and a thickness of e.g. about 800 micrometers (see FIG. 2). Now, it is noted that the wafer size may be any of 450Φ, 200Φ and other size.

Next, an STI insulative film 4 (a device isolation region) having a depth of e.g. 300 nm is formed in a surface of the SOI wafer 1 on the side of the device plane 1a, as shown in FIG. 2. The STI insulative film 4 is formed by forming a trench in the SOI layer 3, the BOX insulator layer 32, and the semiconductor substrate 1s, and embedding the insulative film in the trench.

Subsequently, the SOI type N-channel MISFET well region 5, the SOI type P-channel MISFET well region 6, the bulk type N-channel MISFET well region 7, and the bulk type P-channel MISFET well region 8 are formed in turn by ion implantation from the side of the device plane 1a of the SOI wafer 1, as shown in FIG. 3. The examples of the condition for the implantation are as follows. In the case of making an N type well region, e.g. phosphorus is used, the implantation energy is 200 to 400 KeV approximately, and the dose is $1\times10^{12}$ to $1\times10^{13}/cm^2$ approximately. In the case of making a P type well region, e.g. boron is used, the implantation energy is 100 to 200 KeV approximately, and the dose is $1\times10^{12}$ to $1\times10^{13}/cm^2$ approximately.

Subsequently, the semiconductor-on-insulator layer 3 and the buried insulator layer 32 located on the device plane 1a on the side of the bulk type MISFET formation region Rb are removed by wet etching in a condition where the side of device plane 1a of the wafer 1 in the SOI type MISFET formation region Rs is covered with a resist film 27 for removing an on-bulk BOX layer and the like, as shown in FIG. 4. After that, the disused resist film 27 is removed by ashing or the like. The preferable examples of a liquid remover for the semiconductor-on-insulator layer 3 include e.g. APM (Ammonium Hydroxide/Hydrogen Peroxide Mixture). In addition, the preferable examples of a liquid remover for the buried insulator layer 32 include e.g. BHF (Buffered HF). A removing process by these removers may be executed while using a hard mask. In addition, dry etching may be adopted instead of wet etching.

Next, as shown in FIG. 5, an SOI region gate insulative film 10 (first gate insulative film) is formed on the surface of the wafer 1 on the side of the device plane 1a in the SOI type MISFET formation region Rs, and a bulk region gate insulative film 9 (second gate insulative film) is formed on the surface of the wafer 1 on the side of the device plane 1a in the bulk type MISFET formation region Rb. Subsequently, a first-layer polycrystalline silicon film 11 is formed, as a conductive film, almost all over the surface of the wafer 1 on the side of the device plane 1a by e.g. CVD (Chemical Vapor Deposition).

Then, as shown in FIG. 6, in a condition where the side of the device plane 1a of the wafer 1 in the SOI type MISFET formation region Rs is covered with a resist film 28 for removing a bulk region first-layer polycrystalline silicon film. The first-layer polycrystalline silicon film 11 on the side of the SOI type MISFET formation region Rb is removed by dry etching by use of e.g. halogen-based etching gas.

After that, as shown in FIG. 7, a second-layer polycrystalline silicon film 12 is formed, as a conductive film, almost all over the surface of the wafer 1 on the side of the device plane 1a by CVD. In this example, the second-layer polycrystalline silicon film 12 is arranged to be larger in thickness than the first-layer polycrystalline silicon film 11 in order to surely provide a gate electrode having a sufficient thickness on the bulk side. However, it is noted that such condition is not essential.

Subsequently, dummy gate electrodes 13d and 14d, and gate electrodes 33 and 34 are formed by patterning by a combination of the usual lithography and dry etching as shown in FIG. 8.

Now, to exemplify the relation among the respective parts in height, FIG. 9 shows A-A' and B-B' cross sections of FIG. 8, both taken along the widthwise direction of the gates. That is, the left side portion of FIG. 9 shows the A-A' cross section of the device, and the right side portion shows the B-B' cross section. As shown in FIG. 9, in this example, the top face 1a of the semiconductor substrate 1s is unchanged in height between the bulk type MISFET formation region Rb and the SOI type MISFET formation region Rs in the state as shown in FIG. 8, and therefore the top faces 1a in the bulk type MISFET formation region Rb and the SOI type MISFET formation region Rs make one reference plane, namely a substrate part top face Hrb (a common reference-of-height plane). In the description below concerning the heights or elevations of the respective parts, the common reference-of-height plane Hrb is used as a reference as a rule.

In the CMP process before gate replacement, e.g. the lowest portion of the dummy gate electrode 13d must be higher in height than e.g. the highest portion of the gate electrode 33 for exposing the gate electrode only on the side of the SOI type MISFET formation region Rs (FIG. 13). The height of the highest portion of the gate electrode 33 is the sum of the height Hi of the bulk part isolation, and the thickness Tsp of the second-layer polycrystalline silicon film 12 (the largest height Hgb of the gate electrode of the bulk type MISFET). On the other hand, the height of the lowest portion of the dummy gate electrode 13d is substantially equal to e.g. the sum of the height Hst of the SOT top face, the thickness Tfp of the first-layer polycrystalline silicon film 11, and the thickness Tsp of the second-layer polycrystalline silicon film 12 (namely, the lowest height Hgs of the gate electrode of the SOT type MISFET). This is because the SOI region gate insulative film 10 is considered as being relatively very thin in general. Accordingly, in the condition as described above, the difference between the lowest height Hgs of the gate electrode and the highest height Hgb of the gate electrode (i.e. the height Hd of the lowest top face of the second-layer polycrystalline silicon film 12 in the SOI region Rs with respect to the highest top face of the second-layer polycrystalline silicon film 12 in the bulk region Rb) must be plus. Further, taking into account other process margins of CMP, the difference Hd must be a sufficiently large plus value.

This will be described below more specifically. The height Hi of the bulk part isolation is e.g. about 10 nm. The thickness Tfp of the first-layer polycrystalline silicon film 11 is about 75 nm. The thickness Tsp of the second-layer polycrystalline silicon film 12 is about 100 nm. If the thickness of the interlayer insulative film 22 at the time of gate replacement is made e.g. about 150 nm since it is required to cover the gate electrode 33 sufficiently, the required CMP polishing amount is about 150 nm. Further, factoring in a necessary over polishing amount of about 15 nm, the total polishing amount is about 165 nm. Further, if the thickness of the SOI layer 3 is made e.g. about 15 nm, and the thickness of the BOX layer 32 is made e.g. about 10 nm, the SOI top face height Hst (i.e. the elevation difference between the SOI and bulk regions) is about 25 nm. The thickness of the interlayer insulative film 22 remaining above the highest point of the second-layer polycrystalline silicon film 12 in the bulk region is theoretically about 75 nm at the time when the polishing of about 165 nm has been completed ideally. Incidentally, at this point of time, the second-layer polycrystalline silicon film 12 in the SOI type MISFET formation region Rs has been polished by about 15 nm at the lowest portion thereof, and thus its thickness is about 85 nm. In this way, the lowest portion of the second-layer polycrystalline silicon film 12 in the SOI type MISFET formation region Rs is exposed. The interlayer insulative film 22 of a thickness of about 75 nm remains over the highest portion of the second-layer polycrystalline silicon film 12 in the bulk type MISFET formation region Rb at the time when it has been polished by about 15 nm.

Next, ion implantation is performed from the side of the device plane 1a of the wafer 1, whereby the extension regions 17 and 18, and the LDD regions 15 and 16 are formed in the SOI layer 3 in turn, as shown in FIG. 10. The examples of the condition for ion implantation are as follows. As to the N type extension region 17, the ion species is arsenic, the implantation energy is 2 to 10 KeV approximately, and the dose is $1\times10^{14}$ to $1\times10^{15}/cm^2$ approximately. With the P type extension region 18, for example, the ion species is $BF_2$, the implantation energy is 1 to 5 KeV approximately, and the dose is $1\times10^{14}$ to $1\times10^{15}/cm^2$ approximately. With the N type LDD region 15, for example, the ion species is arsenic; the implantation energy is 5 to 50 KeV approximately, and the dose is $2\times10^{13}$ to $1\times10^{15}/cm^2$ approximately. Further, as to the P type LDD region 16, for example, the ion species is $BF_2$, the implantation energy is 5 to 20 KeV approximately, and the dose is $2\times10^{13}$ to $1\times10^{15}/cm^2$ approximately.

Next, the sidewall spacer 19 is formed around the dummy gate electrodes 13d and 14d, and the gate electrodes 33 and 34 in order to adjust the overlap of ion implantation for source and drain. The sidewall spacer 19 also serves to prevent the dummy gate electrodes 13d and 14d, and the gate electrodes 33 and 34 from being in contact with the source and drain regions 40 in epitaxial growth the subsequent step. Incidentally, the sidewall spacer 19 is formed by an insulative film, and it is composed of e.g. a silicon dioxide film, a silicon nitride film, or a multilayer film including a silicon dioxide film and a silicon nitride film.

Next, the elevated source and drain regions 40 having a thickness of e.g. 20 to 30 nm approximately are formed on the semiconductor surface of the wafer 1 on the side of the device plane 1a by selective epitaxial growth. Subsequently, the N+ type source and drain regions 20 and the P+ type source and drain regions 21 are formed by ion implantation.

Next, e.g. a nickel-based silicide film 26 is formed on the top faces of the N+ type source and drain regions 20, the P+ type source and drain regions 21, and the gate electrodes 13d, 14d, 33 and 34, as shown in FIG. 11. Incidentally, the examples of the material for the silicide layer include e.g. Co, W and Ti in addition to nickel-based metals such as Ni, NiPt, and the like.

Next, the interlayer insulative film 22 is formed by CVD over e.g. almost all the surface on the side of the device plane 1a of the wafer 1, as shown in FIG. 12. The interlayer insulative film 22 includes e.g. a lower layer composed of a relatively thin silicon nitride film serving as a CESL (Contact Etch Stop Layer), an upper layer composed of a relatively thick silicon oxide-based insulative film.

Next, e.g. the processing of planarization such as CMP (Chemical Mechanical Polishing) is executed on the side of the device plane 1a of the wafer 1, thereby exposing upper portions of the gate electrodes 13d and 14d on the side of the SOI type MISFET formation region Rs, as shown in FIG. 13.

Next, e.g. the processing of wet etching is executed on the side of the device plane 1a of the wafer 1, thereby removing the dummy gate electrodes 13d and 14d and the like and forming a gate-electrode-burying opening 29, as shown in FIG. 14. Examples of the etchant suitable for the processing of wet etching include e.g. APM, aqueous solution including a mixture of hydrofluoric acid and nitric acid (so-called hydrofluoric-nitric acid), and the like.

Next, e.g. a high-permittivity gate insulative film 23 having a thickness of a few to more than ten angstroms is formed by e.g. ALCVD (Atomic Layer Chemical Vapor Deposition) on the surface on the side of the device plane 1a of the wafer 1, and inside the gate-electrode-burying opening 29, as shown in FIG. 15. Subsequently, a metal gate electrode film 24 of e.g. a titanium nitride film or the like is grown (to e.g. a thickness of about 10 nm) almost all over the surface of the high-permittivity gate insulative film 23 by e.g. a film growth method such as sputtering.

Next, the gate-charged conductive film 25 (e.g. polycrystalline silicon film) is formed by e.g. CVD on the surface on the side of the device plane 1a of the wafer 1, and inside the gate-electrode-burying opening 29, as shown in FIG. 16.

Next, the processing of planarization is executed on the surface on the side of the device plane 1a of the wafer 1 by e.g. CMP, thereby removing the disused gate-charged conductive film 25, metal gate electrode film 24, and high-permittivity gate insulative film 23 on the surface on the side of the device plane 1a, as shown in FIG. 17.

After that, an auxiliary interlayer insulative film is formed, followed by making a contact hole, burying a tungsten plug, and conducting other processing, and then the FEOL process is completed. Thereafter, the process to be executed is transferred to the BEOL process, where a multilayer wiring line having an adequate number of layers (e.g. a copper-based buried wiring line) is formed as needed. Then, the pad metal layer, the final passivation film and the like are formed, and the requisite backside grinding and other processing are executed, and the resultant wafer 1 is divided into chips 2 by dicing or the like.

3. Description of the modification (i.e. varying-elevation substrate top face type device) in connection with the substrate structure of the semiconductor integrated circuit device of the above embodiment (See FIG. 18 chiefly.)

In the device mainly described in the section 1, the bulk type MISFET formation region Rb is substantially identical with the SOI type MISFET formation region Rs in the height of the top face of the semiconductor substrate 1s. However, in the example to be described here, the SOI type MISFET formation region Rs is relatively higher than the bulk type MISFET formation region Rb in the height of the top face of the semiconductor substrate 1s. In other words, an elevation difference is provided between the top face of the semiconductor substrate 1s in the bulk type MISFET formation region Rb, and the top face of the semiconductor substrate 1s in the SOI type MISFET formation region Rs. Various methods can be adopted as a method for making an elevation difference like this. While in the section 4, one of the examples of the method is described, the method for making the elevation difference is not limited to the example.

Figure 18:
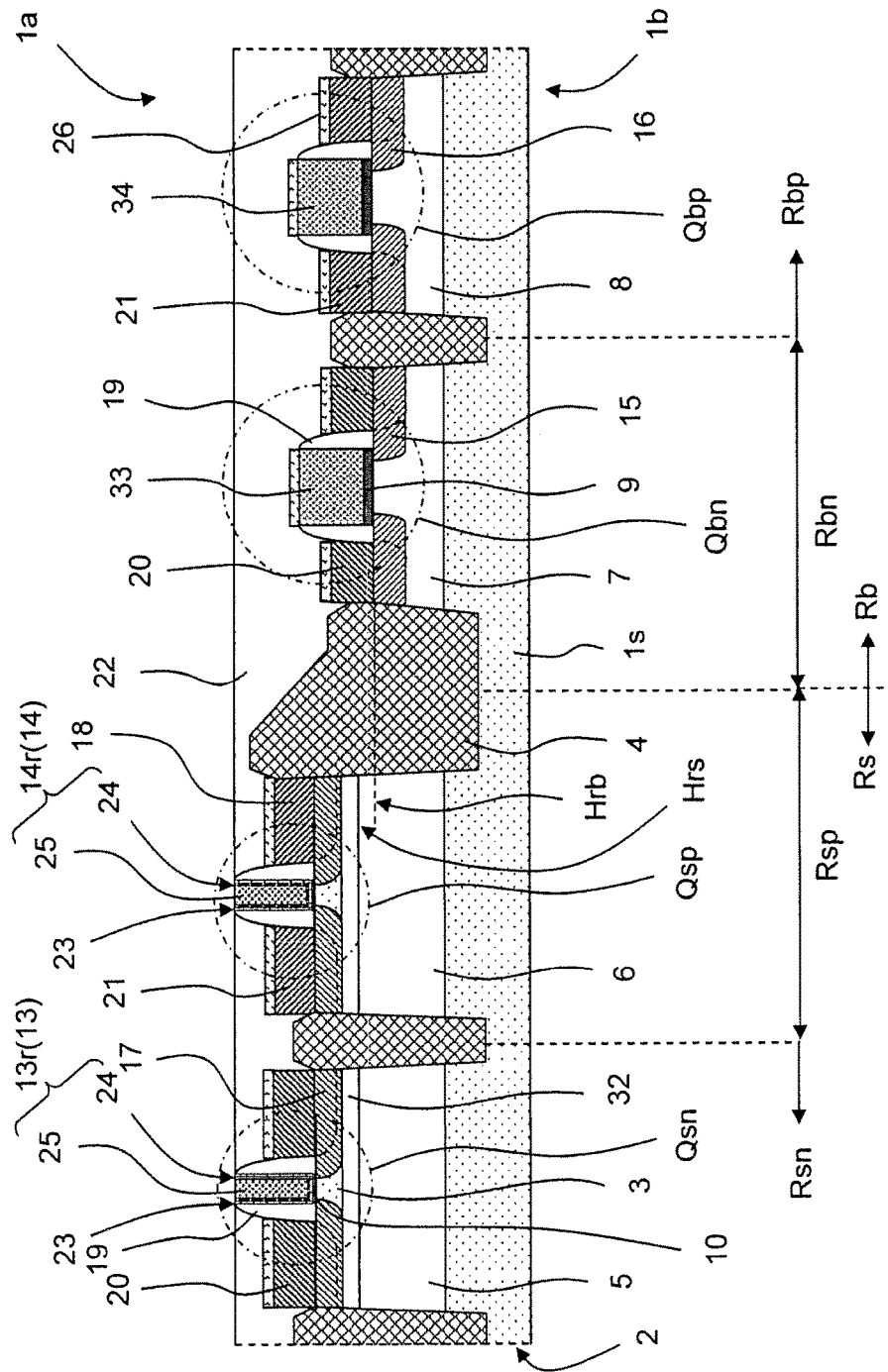
FIG. 18 is a device sectional view for explaining a modification (i.e. a varying-elevation substrate top face type device) in connection with the substrate structure of the semiconductor integrated circuit device according to the embodiment.

FIG. 18 is a device sectional view for explaining a modification (i.e. a varying-elevation substrate top face type device) in connection with the substrate structure of the semiconductor integrated circuit device according to the embodiment. The modification (i.e. a varying-elevation substrate top face type device) in connection with the substrate structure of the semiconductor integrated circuit device according to the embodiment will be described with reference to the drawing.

As is clear from the drawing, the device shown in FIG. 18 is almost the same as that shown in FIG. 1 in structure. However, first the device shown in FIG. 18 is different from the device shown in FIG. 1 in that the gate-charged conductive films 25 of the SOI type N-channel MISFET (Qsn) and the SOI type P-channel MISFET (Qsp) are substantially identical, in thickness, to the gate electrode 33 (the second gate electrode) of the bulk type N-channel MISFET (Qbn) and the gate electrode 34 of the bulk type P-channel MISFET (Qbp).

Second, the device shown in FIG. 18 is different from the device shown in FIG. 1 in that the substrate part top face (common reference-of-height plane) Hrb in the bulk type MISFET formation region differs in height from the substrate part top face Hrs in the SOI type MISFET formation region. That is, in this example, the height of the substrate part top face Hrs in the SOI type MISFET formation region is higher than that of the substrate part top face Hrb in the bulk type MISFET formation region.

4. Description of a single-layer polycrystalline silicon process as an example of a manufacturing method for a semiconductor integrated circuit device arranged for the modification (i.e. varying-elevation substrate top face type device) in connection with the substrate structure (See FIGS. 19 to 28 chiefly.)

This section describes the single-layer polycrystalline silicon process. However, it is also possible to apply the double-layer polycrystalline silicon process described in the section 2 to the example involving an elevation difference like this. The application of the double-layer polycrystalline silicon process makes the process more complicated in comparison to the application of the single-layer polycrystalline silicon process, but allows the further increase in the CMP process margin.

Figure 19:
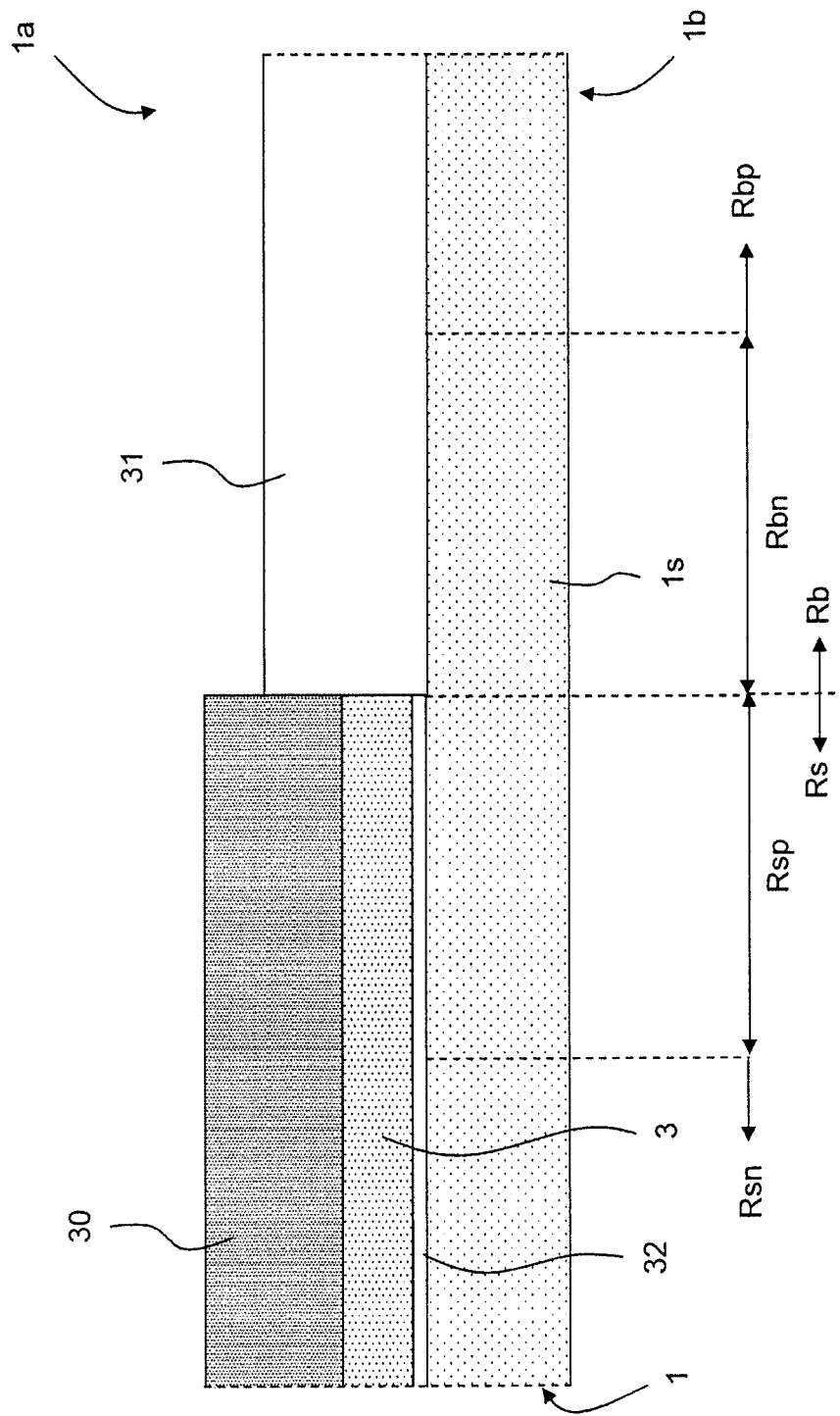
FIG. 19 is a device sectional view for explaining a single-layer polycrystalline silicon process as an example of the manufacturing method for a semiconductor integrated circuit device arranged for the modification (i.e. varying-elevation substrate top face type device) in connection with the substrate structure, which shows the device shown in FIG. 18 in course of the wafer process (bulk-side LOCOS oxidation process)
Figure 20:
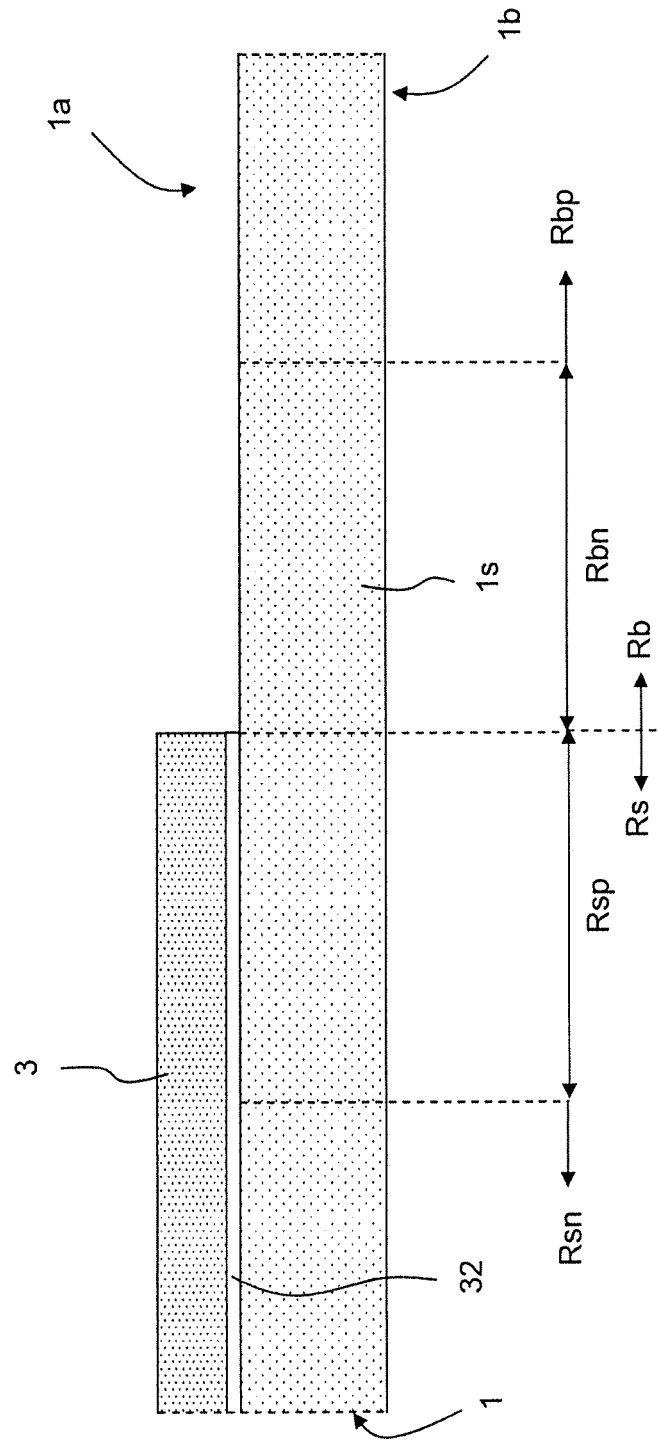
FIG. 20 is a device sectional view for explaining the single-layer polycrystalline silicon process as an example of the manufacturing method for a semiconductor integrated circuit device arranged for the modification (i.e. varying-elevation substrate top face type device) in connection with the substrate structure, which shows the device shown in FIG. 18 in course of a wafer process (specifically, a LOCOS oxide film removing process)
Figure 21:
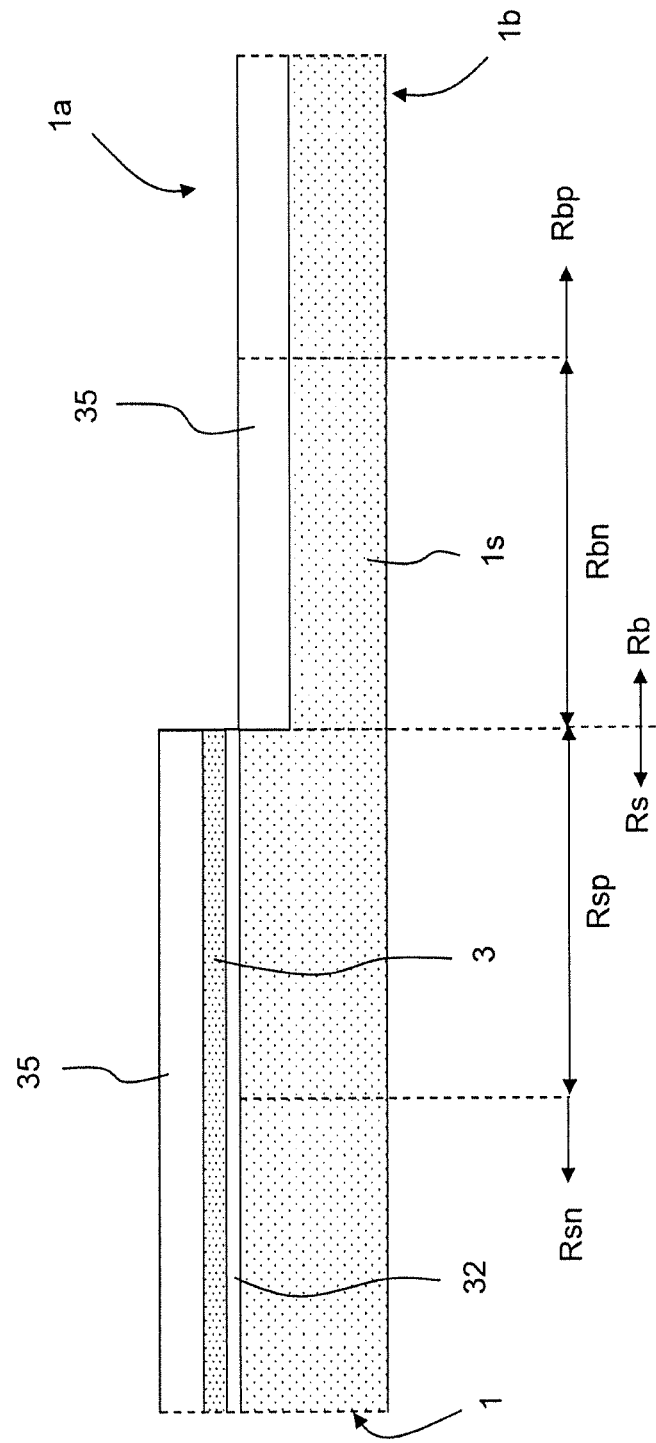
FIG. 21 is a device sectional view for explaining the single-layer polycrystalline silicon process as an example of the manufacturing method for a semiconductor integrated circuit device arranged for the modification (i.e. varying-elevation substrate top face type device) in connection with the substrate structure, which shows the device shown in FIG. 18 in course of a wafer process (specifically, an oxidation process for SOI film thickness adjustment)
Figure 22:
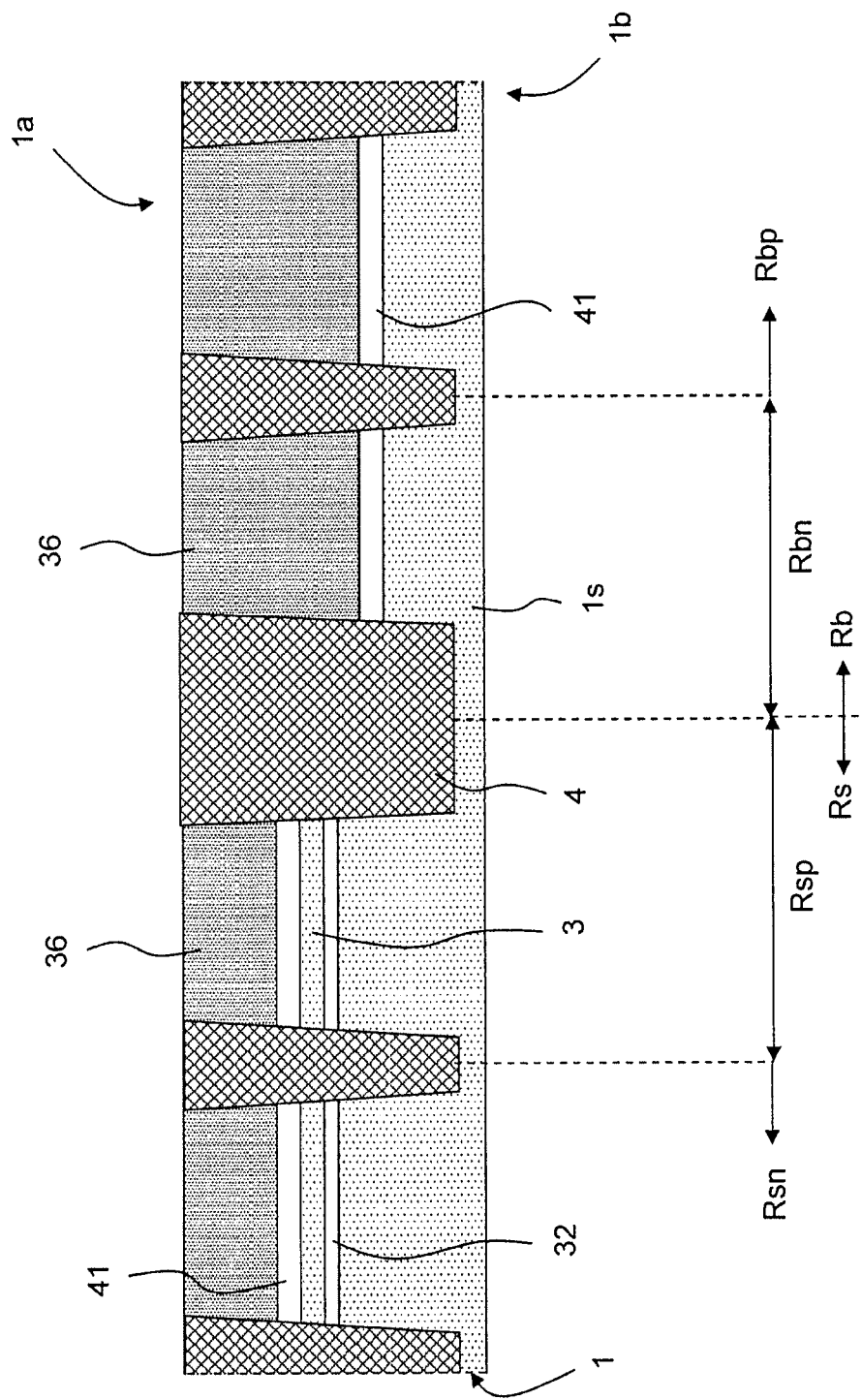
FIG. 22 is a device sectional view for explaining the single-layer polycrystalline silicon process as an example of the manufacturing method for a semiconductor integrated circuit device arranged for the modification (i.e. varying-elevation substrate top face type device) in connection with the substrate structure, which shows the device shown in FIG. 18 in course of a wafer process (specifically, an STI region burying process)
Figure 23:
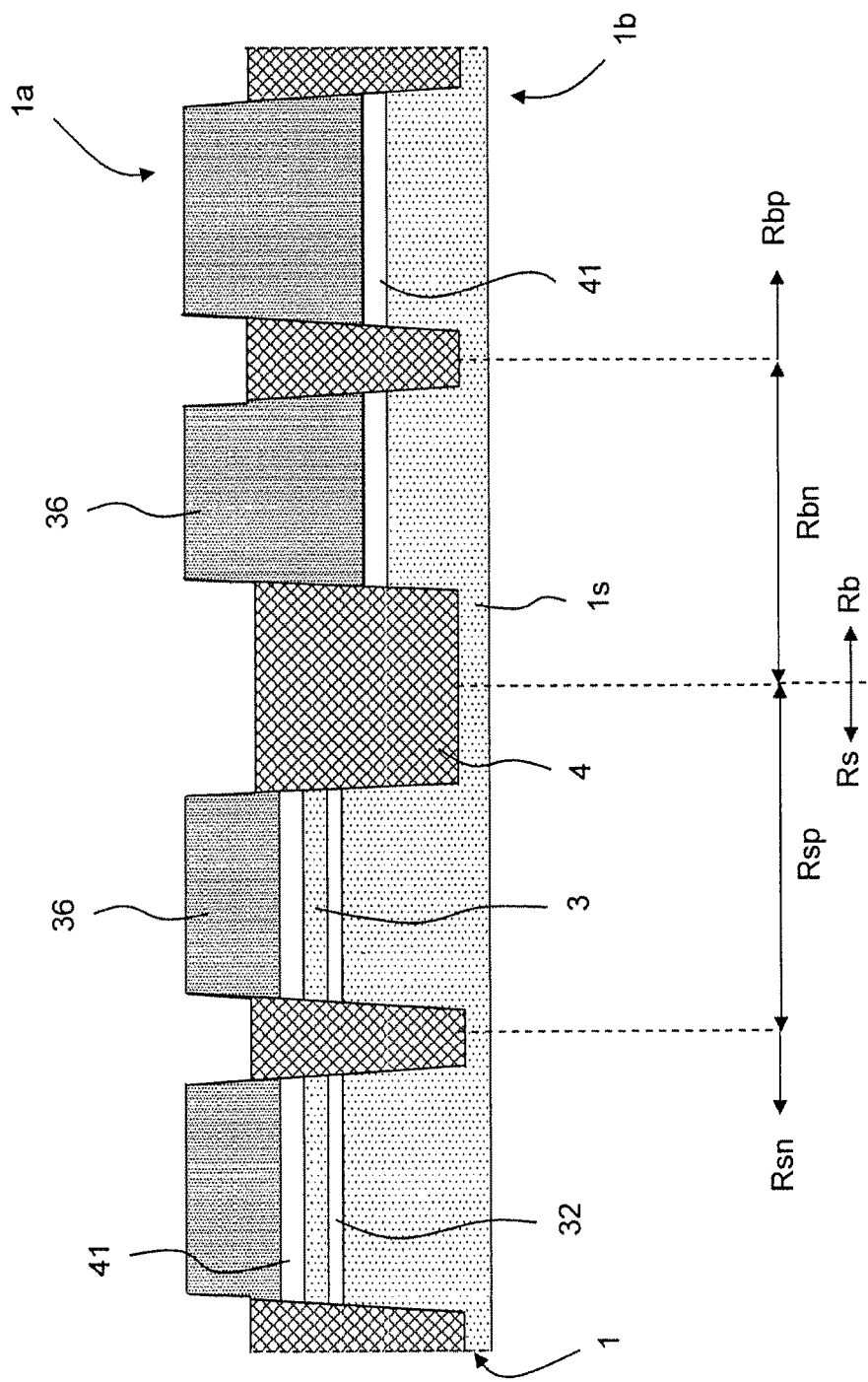
FIG. 23 is a device sectional view for explaining the single-layer polycrystalline silicon process as an example of the manufacturing method for a semiconductor integrated circuit device arranged for the modification (i.e. varying-elevation substrate top face type device) in connection with the substrate structure, which shows the device shown in FIG. 18 in course of a wafer process (specifically, an STI height adjustment process)
Figure 24:
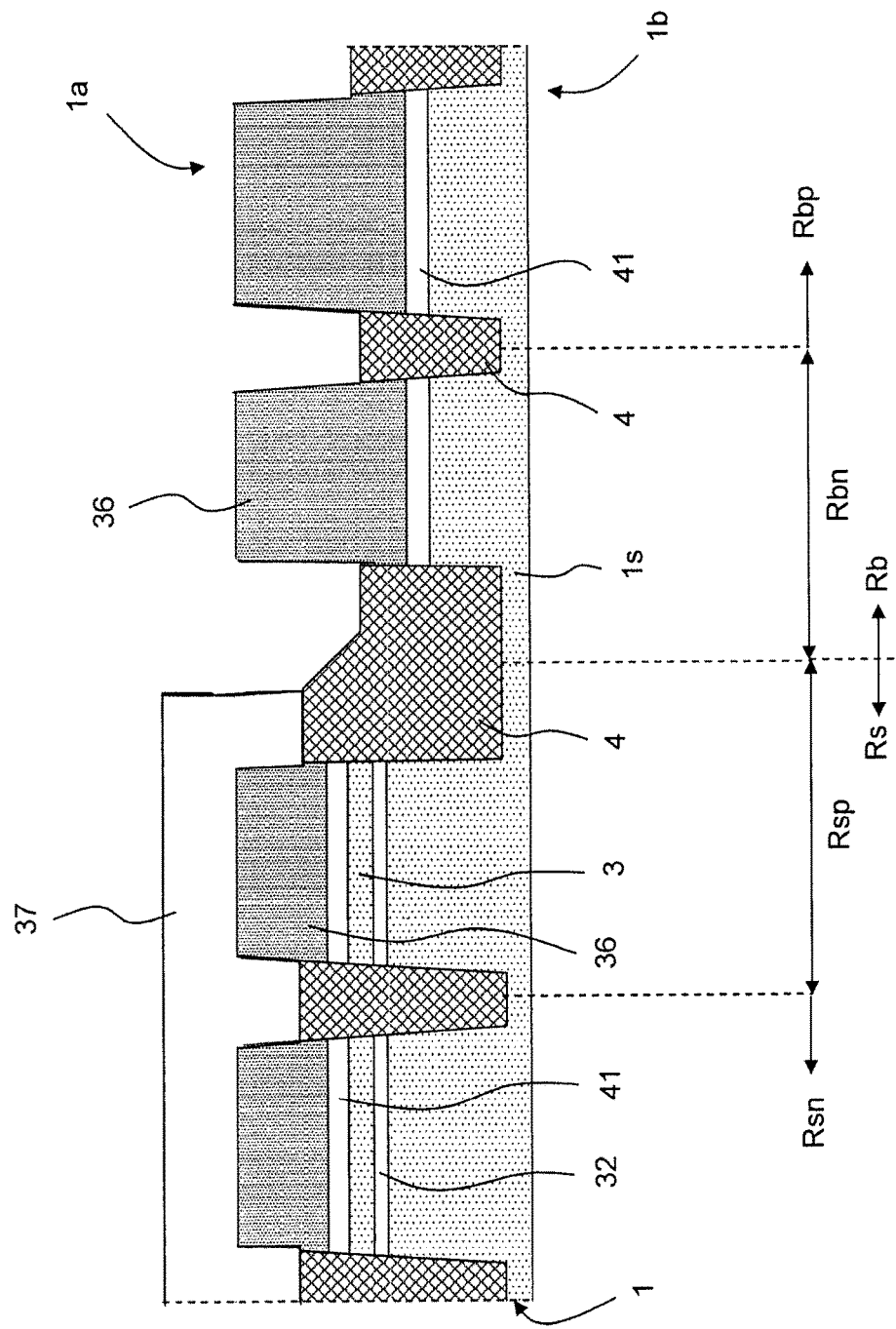
FIG. 24 is a device sectional view for explaining the single-layer polycrystalline silicon process as an example of the manufacturing method for a semiconductor integrated circuit device arranged for the modification (i.e. varying-elevation substrate top face type device) in connection with the substrate structure, which shows the device shown in FIG. 18 in course of a wafer process (specifically, a process for readjustment of bulk region STI height)
Figure 25:
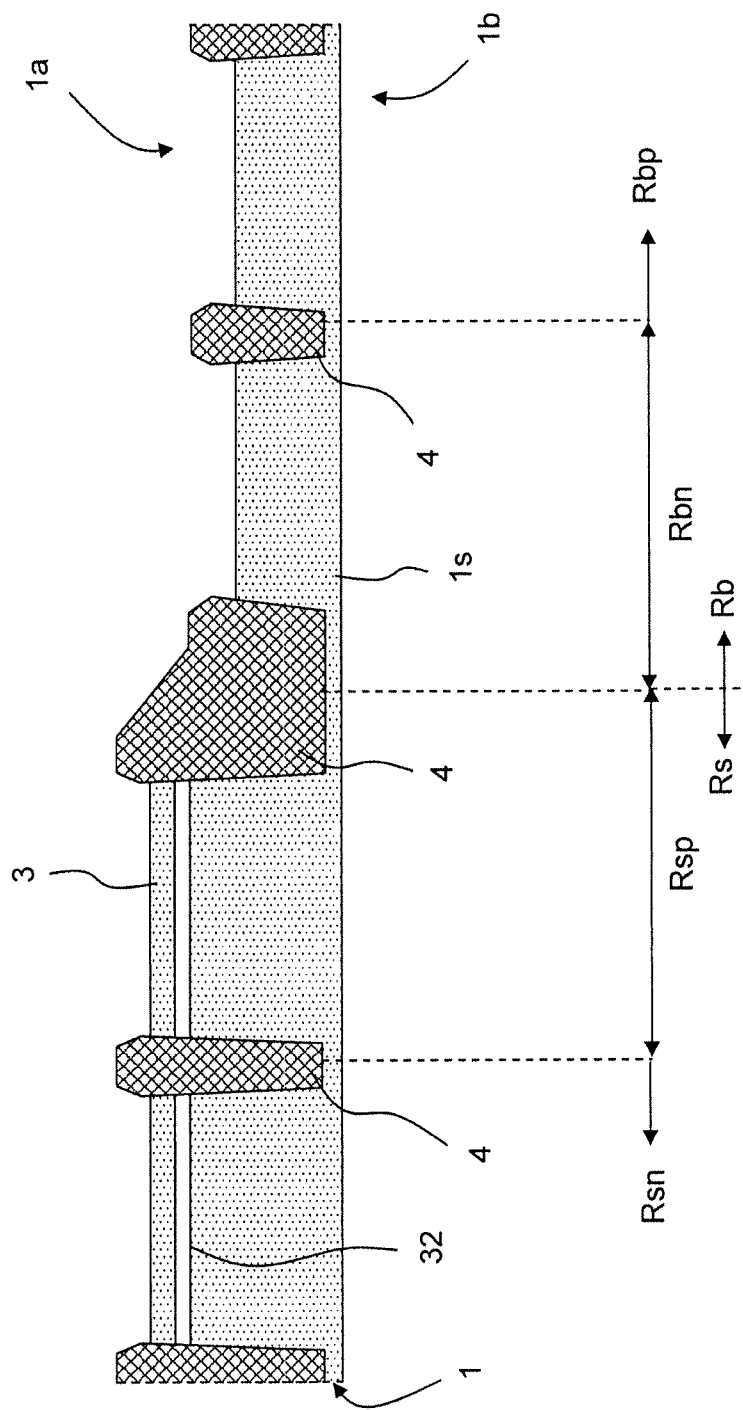
FIG. 25 is a device sectional view for explaining the single-layer polycrystalline silicon process as an example of the manufacturing method for a semiconductor integrated circuit device arranged for the modification (i.e. varying-elevation substrate top face type device) in connection with the substrate structure, which shows the device shown in FIG. 18 in course of a wafer process (specifically, a process for exposure of a substrate top face of the bulk region)
Figure 26:
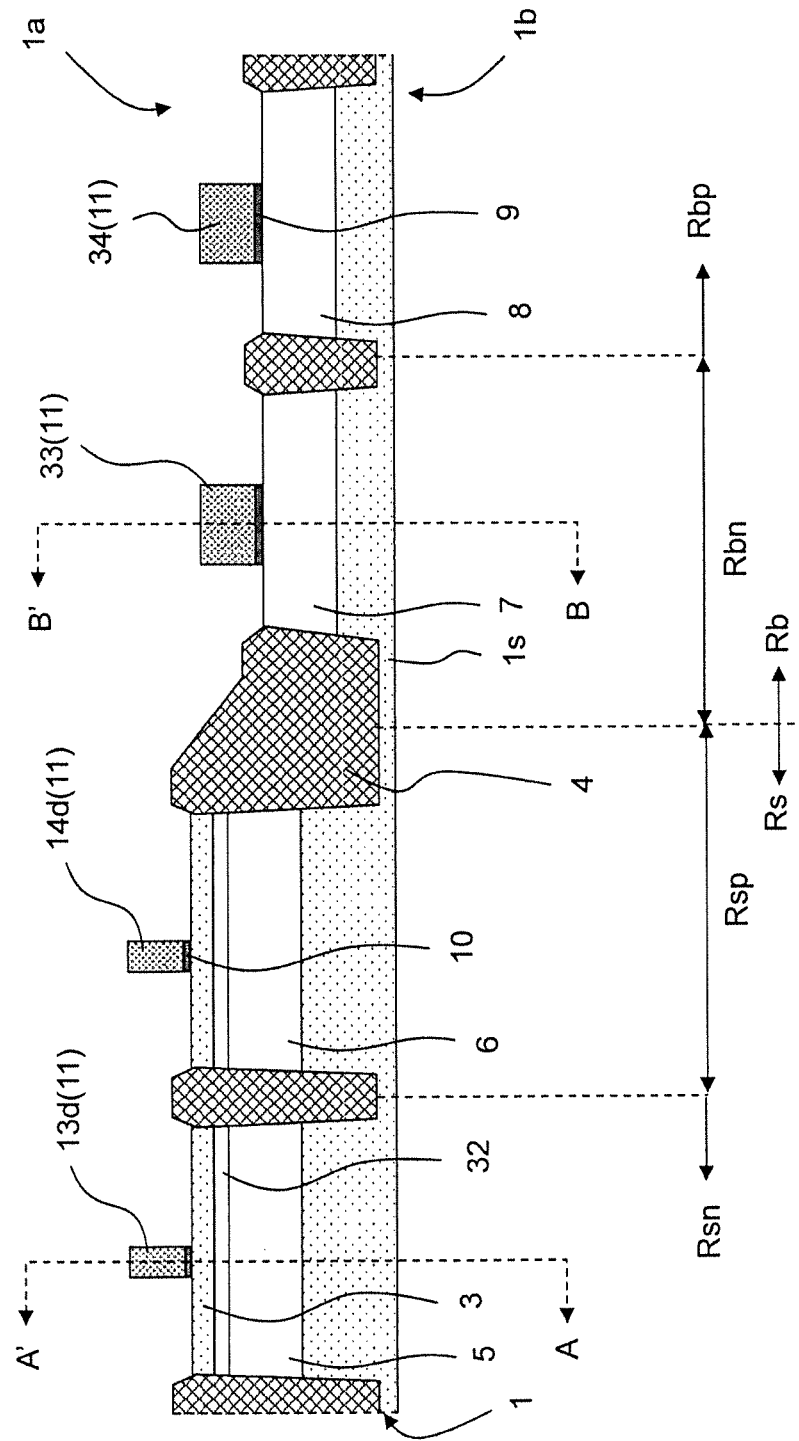
FIG. 26 is a device sectional view for explaining the single-layer polycrystalline silicon process as an example of the manufacturing method for a semiconductor integrated circuit device arranged for the modification (i.e. varying-elevation substrate top face type device) in connection with the substrate structure, which shows the device shown in FIG. 18 in course of a wafer process (specifically, a gate-machining process)
Figure 27:
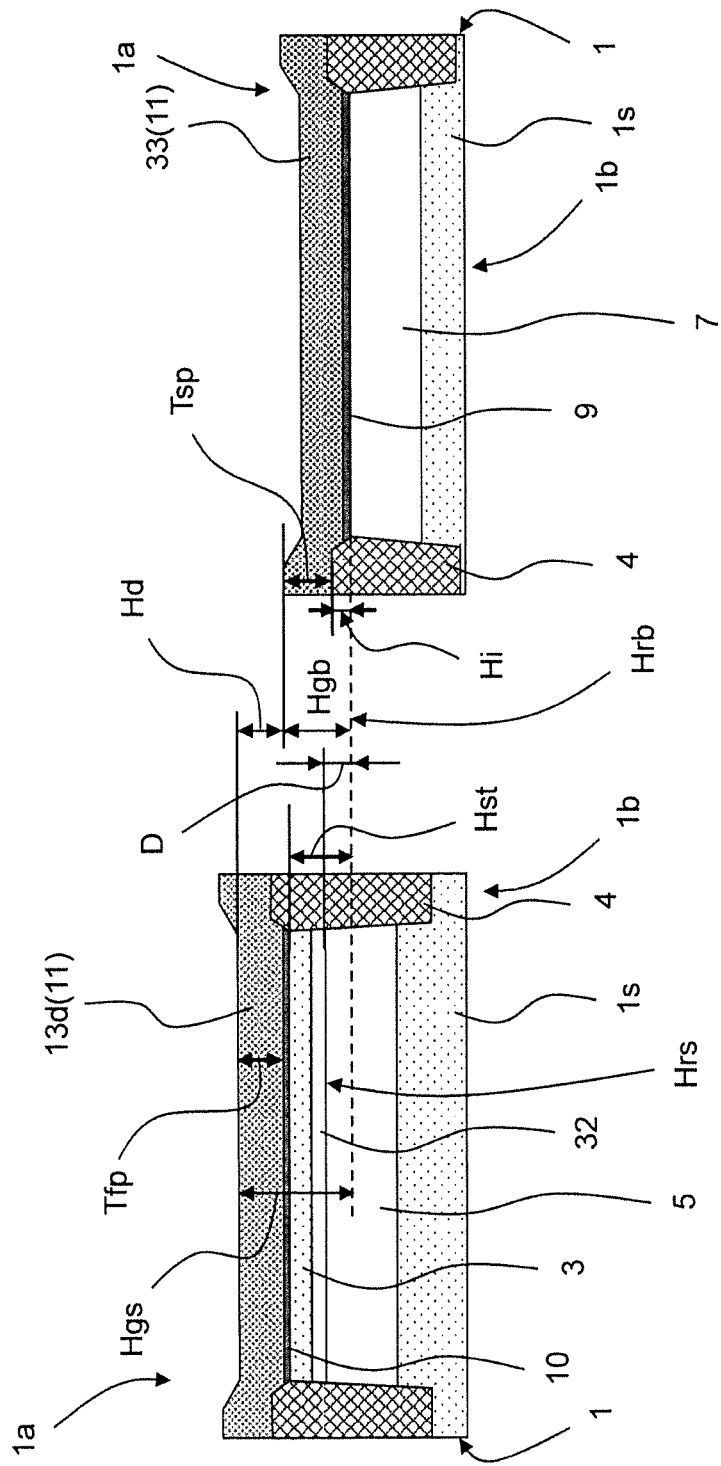
FIG. 27 is an explanatory sectional view for explaining a device cross section taken along the line A-A' of FIG. 26 (on the left side), and a device cross section taken along the line B-B' (on the right side)
Figure 28:
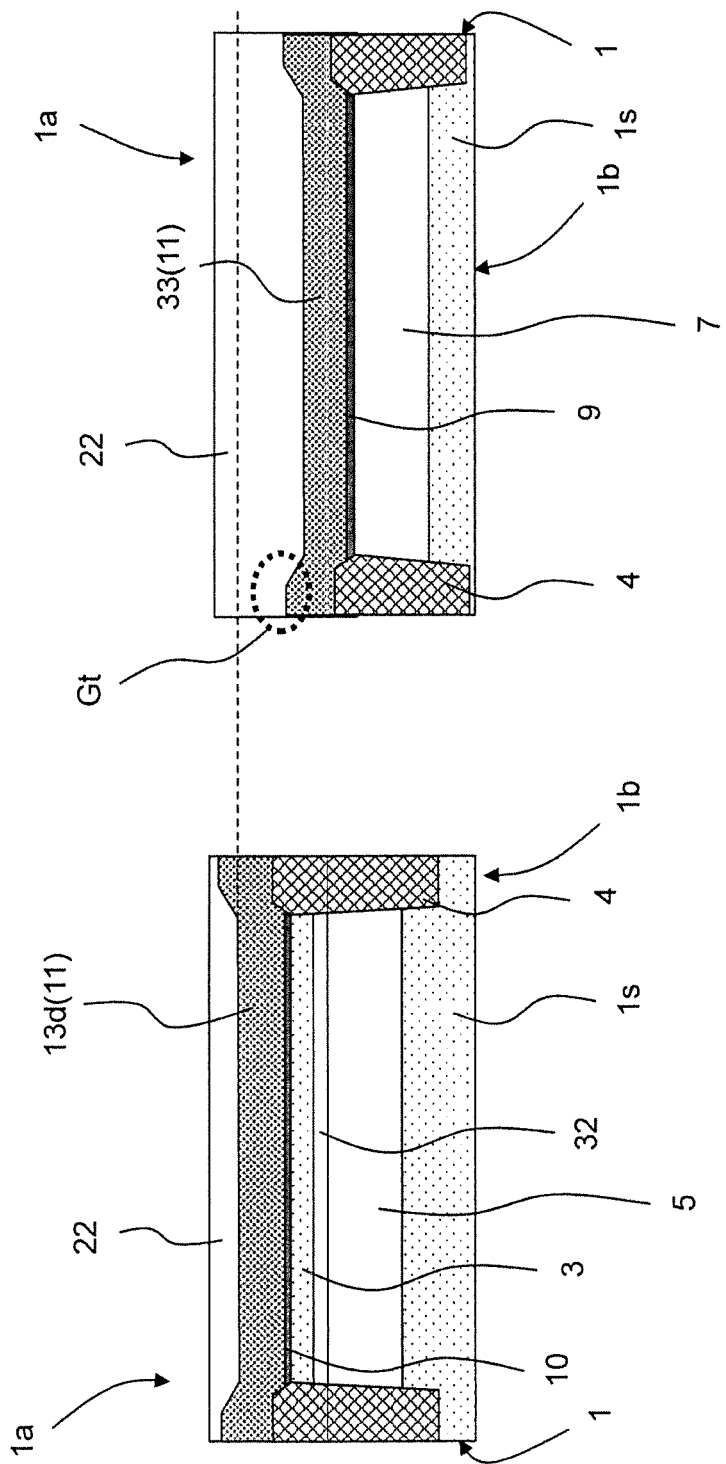
FIG. 28 is an explanatory sectional view showing the device in course of the pre-gate-replacement CMP process, and corresponding to FIG. 27.

FIG. 19 is a device sectional view for explaining a single-layer polycrystalline silicon process as an example of the manufacturing method for a semiconductor integrated circuit device arranged for the modification (i.e. varying-elevation substrate top face type device) in connection with the substrate structure, which shows the device shown in FIG. 18 in course of the wafer process (bulk-side LOCOS oxidation process). FIG. 20 is a device sectional view for explaining the single-layer polycrystalline silicon process as an example of the manufacturing method for a semiconductor integrated circuit device arranged for the modification (i.e. varying-elevation substrate top face type device) in connection with the substrate structure, which shows the device shown in FIG. 18 in course of a wafer process (specifically, a LOCOS oxide film removing process). FIG. 21 is a device sectional view for explaining the single-layer polycrystalline silicon process as an example of the manufacturing method for a semiconductor integrated circuit device arranged for the modification (i.e. varying-elevation substrate top face type device) in connection with the substrate structure, which shows the device shown in FIG. 18 in course of a wafer process (specifically, an oxidation process for SOI film thickness adjustment). FIG. 22 is a device sectional view for explaining the single-layer polycrystalline silicon process as an example of the manufacturing method for a semiconductor integrated circuit device arranged for the modification (i.e. varying-elevation substrate top face type device) in connection with the substrate structure, which shows the device shown in FIG. 18 in course of a wafer process (specifically, an STI region burying process). FIG. 23 is a device sectional view for explaining the single-layer polycrystalline silicon process as an example of the manufacturing method for a semiconductor integrated circuit device arranged for the modification (i.e. varying-elevation substrate top face type device) in connection with the substrate structure, which shows the device shown in FIG. 18 in course of a wafer process (specifically, an STI height adjustment process). FIG. 24 is a device sectional view for explaining the single-layer polycrystalline silicon process as an example of the manufacturing method for a semiconductor integrated circuit device arranged for the modification (i.e. varying-elevation substrate top face type device) in connection with the substrate structure, which shows the device shown in FIG. 18 in course of a wafer process (specifically, a process for readjustment of bulk region STI height). FIG. 25 is a device sectional view for explaining the single-layer polycrystalline silicon process as an example of the manufacturing method for a semiconductor integrated circuit device arranged for the modification (i.e. varying-elevation substrate top face type device) in connection with the substrate structure, which shows the device shown in FIG. 18 in course of a wafer process (specifically, a process for exposure of a substrate top face of the bulk region). FIG. 26 is a device sectional view for explaining the single-layer polycrystalline silicon process as an example of the manufacturing method for a semiconductor integrated circuit device arranged for the modification (i.e. varying-elevation substrate top face type device) in connection with the substrate structure, which shows the device shown in FIG. 18 in course of a wafer process (specifically, a gate-machining process). FIG. 27 is an explanatory sectional view for explaining a device cross section taken along the line A-A' of FIG. 26 (on the left side), and a device cross section taken along the line B-B' (on the right side). FIG. 28 is an explanatory sectional view showing the device in course of the pre-gate-replacement CMP process, and corresponding to FIG. 27. The single-layer polycrystalline silicon process as an example of the manufacturing method for a semiconductor integrated circuit device arranged for the modification (i.e. varying-elevation substrate top face type device) in connection with the substrate structure will be described with reference to these drawings.

First, an SOI wafer 1 is prepared in the same way as described in the section 2. As shown in FIG. 19, an LOCOS oxide film 31 is formed by oxidizing, e.g. by heat, the device plane 1a (first principal plane) of the SOI wafer 1 on the side of the bulk type MISFET formation region Rb until the SOI silicon semiconductor layer 3 (SOI layer or semiconductor-on-insulator layer) disappears with the side of the SOI type MISFET formation region Rs covered with the silicon nitride film 30 for LOCOS oxidation.

Next, as shown in FIG. 20, the silicon nitride film 30 for LOCOS oxidation is removed by wet etching using e.g. hot phosphoric acid. Subsequently, the LOCOS oxide film 31 is removed by wet etching using a hydrofluoric acid-based silicon dioxide film etchant of e.g. BHF or the like.

Next, the thickness of the SOI layer 3 is adjusted by oxidizing (e.g. thermally oxidizing) the surface of the SOI layer 3 on the side of the SOI type MISFET formation region Rs, and the surface of the semiconductor wafer 1s on the side of the bulk type MISFET formation region Rb thereby to form an oxide film 35 for SOI film thickness adjustment, as shown in FIG. 21. After that, the oxide film 35 for SOI film thickness adjustment is removed by wet etching using a hydrofluoric acid-based silicon dioxide film etchant of e.g. BHF or the like.

Next, a pad silicon dioxide film 41 (having a thickness of e.g. about 10 nm) is formed almost all over the semiconductor surface on the side of the device plane 1a of the semiconductor wafer 1 by e.g. thermal oxidation according to the typical STI process, as shown in FIG. 22. Subsequently, a silicon nitride film 36 for STI formation (having a thickness of e.g. about 70 nm) is formed almost all over the resultant semiconductor surface on the side of the device plane 1a of the semiconductor wafer 1 by e.g. CVD. Then, the silicon nitride film 36 for STI formation, the pad silicon dioxide film 41, and the silicon member located on the surface of the semiconductor wafer 1s are etched by the usual lithography and anisotropy dry etching, thereby forming a trench for STI. Subsequently, a silicon oxide-based insulative film is formed by e.g. CVD on the surface on the side of the device plane 1a of the semiconductor wafer 1 and the surface inside the trench for STI. Further, the disused silicon oxide-based insulative film outside the trench for STI is removed by e.g. CMP, thereby forming the STI insulative film 4 (device isolation region).

Next, the elevation difference in top faces between the STI insulative film 4 and the wafer 1 is adjusted by wet-etching an upper portion of the STI insulative film 4 by use of a hydrofluoric acid-based silicon dioxide film etchant of e.g. BHF or the like, as shown in FIG. 23.

Next, an additional elevation difference adjustment of top faces of the STI insulative film 4 and the wafer 1 on the side of the bulk type MISFET formation region Rb is executed by wet-etching an upper portion of the STI insulative film 4 by use of a hydrofluoric acid-based silicon dioxide film etchant of e.g. BHF or the like with the side of the SOI type MISFET formation region Rs covered with a resist film 37 for STI height adjustment, as shown in FIG. 24. After that, the disused resist film 37 for STI height adjustment is removed by e.g. ashing, and the silicon nitride film 36 for STI formation is removed by wet etching using e.g. hot phosphoric acid. After the pad silicon dioxide film 41 has been removed by wet etching using a hydrofluoric acid-based silicon dioxide film etchant of e.g. BHF or the like at the end, the device cross section as shown in FIG. 25 is obtained.

Next, as in the well implantation process described with reference to FIG. 3, the SOI type N-channel MISFET well region 5, the SOI type P-channel MISFET well region 6, the bulk type N-channel MISFET well region 7, and the bulk type P-channel MISFET well region 8 are formed by ion implantation as shown in FIG. 26. Then, the SOI region gate insulative film 10 (first gate insulative film), the bulk region gate insulative film 9 (second gate insulative film), and the first-layer polycrystalline silicon film 11 are formed in the same way as described with reference to FIG. 5. Subsequently, the dummy gate electrodes 13d and 14d, and the gate electrodes 33 and 34 are formed by patterning the first-layer polycrystalline silicon film 11 in the same way as described with reference to FIG. 8.

Now, to exemplify the relation among the respective parts in height, FIG. 27 shows A-A' and B-B' cross sections of FIG. 26, both taken along the widthwise direction of the gates, and FIG. 28 shows the cross sections in course of the insulative film's CMP before gate replacement. That is, in FIGS. 27 and 28, the left side portion thereof shows the A-A' cross section, and the right side portion shows the B-B' cross section. As shown in FIG. 27, in this example, the top face 1a of the semiconductor substrate 1s (i.e. the lower face of the BOX layer 32 in the SOI type MISFET formation region Rs) is changed in height between the bulk type MISFET formation region Rb and SOI type MISFET formation region Rs in the state as shown in FIG. 26. In the description below concerning the heights or elevations of the respective parts, the common reference-of-height plane Hrb is used as a reference as a rule. In this example, the height of Hgs the top face 1a of the semiconductor substrate 1s in the SOI type MISFET formation region Rs is arranged to be higher than the common reference-of-height plane Hrb (the top face 1a of the semiconductor substrate 1s in the bulk type MISFET formation region Rb) by a substrate top face elevation difference D.

To expose the gate electrode only on the side of the SOI type MISFET formation region Rs in the CMP process before gate replacement (FIG. 28), e.g. the height of the lowest portion of the dummy gate electrode 13d must be higher than e.g. the height of the highest portion (Gt) of the gate electrode 33. The height of the most highest portion of the gate electrode 33 represents the sum of the height Hi of the bulk part isolation, and the thickness Tfp of the first-layer polycrystalline silicon film 11, namely the highest height Hgb of the gate electrode of the bulk type MISFET. On the other hand, the height of the lowest portion of the dummy gate electrode 13d is substantially equal to e.g. the sum of the height Hst of the SOI top face and the thickness Tfp of the first-layer polycrystalline silicon film 11 (namely, the lowest height Hgs of the gate electrode of the SOI type MISFET). This is because the SOI region gate insulative film 10 is considered as to be relatively very thin in general. Accordingly, in the condition as described above, the difference between the lowest height Hgs of the gate electrode and the highest height Hgb of the gate electrode (i.e. the height Hd of the lowest top face of the first-layer polycrystalline silicon film 11 in the SOI region Rs with respect to the highest top face of the first-layer polycrystalline silicon film 11 in the bulk region Rb) must be plus. Further, taking into account other process margins of CMP, the difference Hd must be a sufficiently large plus value.

This will be described below more specifically. The height Hi of the bulk part isolation is e.g. about 10 nm. The thickness Tfp of the first-layer polycrystalline silicon film 11 is about 100 nm. If the thickness of the interlayer insulative film 22 at the time of gate replacement is made e.g. about 150 nm since it is required to cover the gate electrode 33 sufficiently, the required CMP polishing amount is about 150 nm. Further, factoring in a necessary over polishing amount of about 15 nm, the total polishing amount is about 165 nm. Further, if the thickness of the SOI layer 3 is made e.g. about 15 nm, and the thickness of the BOX layer 32 is made e.g. about 10 nm, the SOI top face height Hst (i.e. the elevation difference between the SOI and bulk regions) is about 25 nm. The thickness of the interlayer insulative film 22 remaining above the highest point of the second-layer polycrystalline silicon film 12 in the bulk region is theoretically about 30 nm at the time when the polishing of about 165 nm has been completed ideally. Incidentally, at this point of time, the first-layer polycrystalline silicon film 11 in the SOI type MISFET formation region Rs has been polished by about 15 nm at the lowest portion thereof, and thus its thickness is about 85 nm. In this way, the lowest portion of the first-layer polycrystalline silicon film 11 in the SOI type MISFET formation region Rs is exposed. The interlayer insulative film 22 of a thickness of about 30 nm remains over the highest portion of the first-layer polycrystalline silicon film 11 in the bulk type MISFET formation region Rb at the time when it has been polished by about 15 nm.

Incidentally, it is also possible to apply the double-layer polycrystalline silicon process described in the section 2 to the example. In such case, the process margin of insulative film CMP before gate replacement can be increased greatly. On the other hand, the single-layer polycrystalline silicon process as described in this section has the advantage of making the process significantly simpler and easier.

5. Description of a modification (additional implantation of back gate impurities) concerning the back gate impurity structure of the semiconductor integrated circuit device according to the embodiment (See FIG. 29 chiefly.)

This section concretely describes an example where the basic device structure described in the section 1 is provided with an additional impurity region. However, it is obvious that what is described here can be also applied to the device structure described in the section 3.

Figure 29:
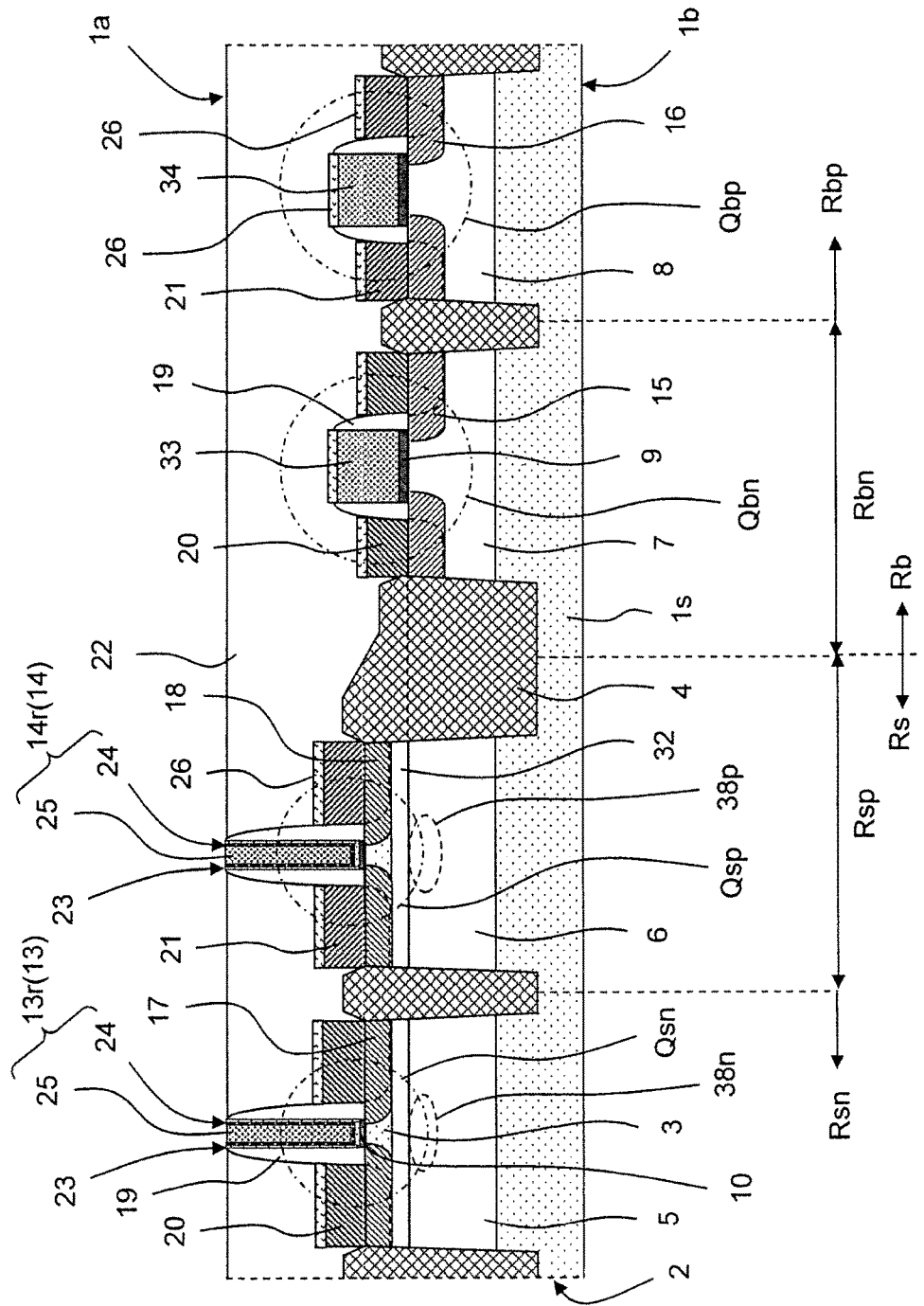
FIG. 29 is a device sectional view for explaining a modification (i.e. a back gate impurity additional implantation) in connection with a back gate impurity structure of the semiconductor integrated circuit device according to the embodiment.

FIG. 29 is a device sectional view for explaining a modification (i.e. a back gate impurity additional implantation) in connection with a back gate impurity structure of the semiconductor integrated circuit device according to the embodiment. The modification (i.e. a back gate impurity additional implantation) in connection with the back gate impurity structure of the semiconductor integrated circuit device according to the embodiment will be described with reference to the drawing.

While the basic structure of the device is the same as that shown in FIG. 1, the device structure is different, as shown in FIG. 29, in that additional impurity-doped regions including an SOI type N-channel MISFET well region additional impurity implantation region 38n and an SOI type 2-channel MISFET well region additional impurity implantation region 38p are provided in back gate regions in addition to the structure shown in FIG. 1. By providing the impurity-doped region 38n and the impurity-doped region 38p, the variation of the threshold voltage in case that the N type well region 5 and the P type well region 6 operate as back gates can be increased, and the SOI type N-channel MISFET and the SOI type P-channel MISFET can be improved in their characteristics.

6. Description an example of the manufacturing method for a semiconductor integrated circuit device arranged for the modification (i.e. a back gate impurity additional implantation) in connection with the back gate impurity structure (See FIGS. 30 and 31 chiefly.)

While this section concretely describes the manufacturing process assuming the device structure described in the section 5, it is needless to say that the manufacturing process may be applied to the device structure as described in the section 3.

The entire flow of the process is exactly the same as described with reference to FIGS. 2 to 17 in the section 2. However, there is a difference in an additional dose process to be described with reference to FIG. 14 is included. Hence, only the difference will be described below.

Figure 30:
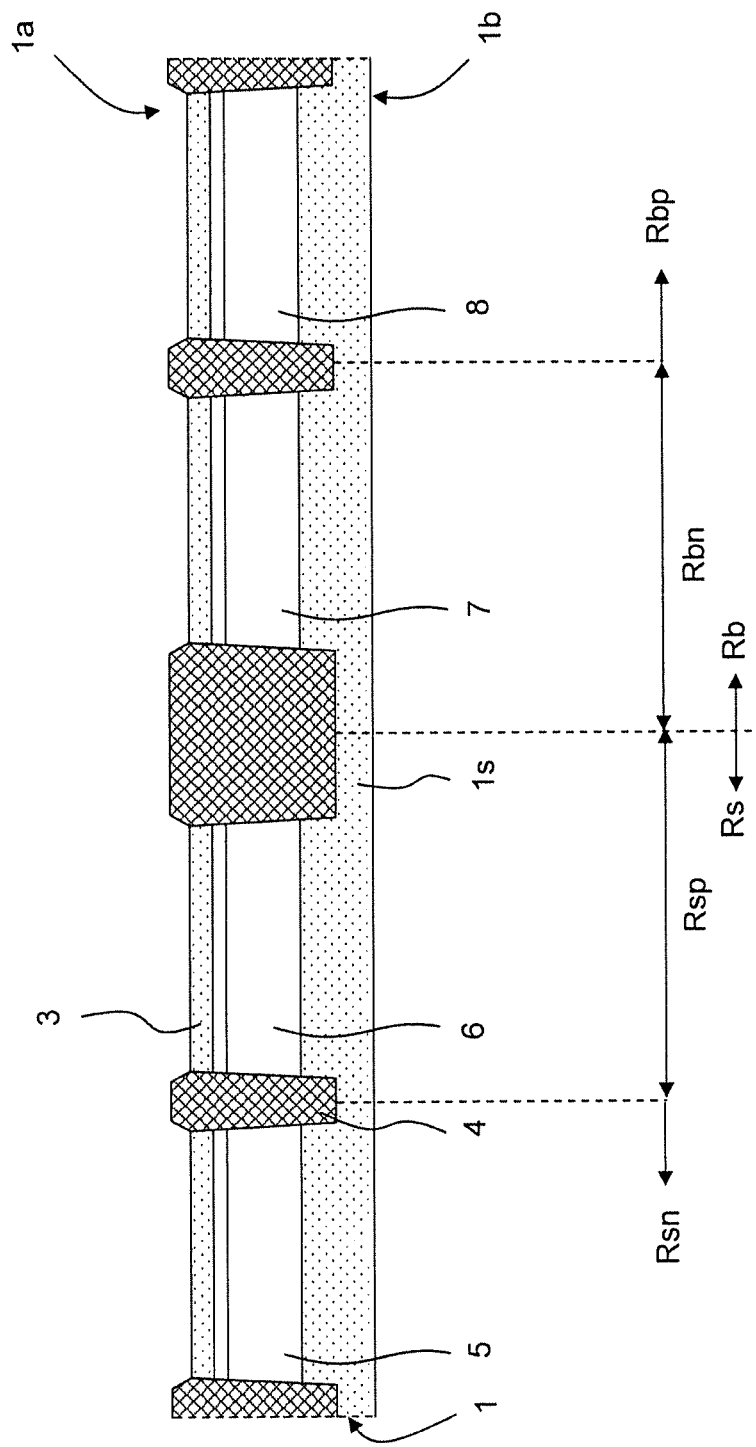
FIG. 30 is a device sectional view for explaining an example of the manufacturing method for a semiconductor integrated circuit device arranged for the modification (i.e. the back gate impurity additional implantation) in connection with the back gate impurity structure of the device shown in FIG. 29 in course of a wafer process (specifically, a well-forming process)
Figure 31:
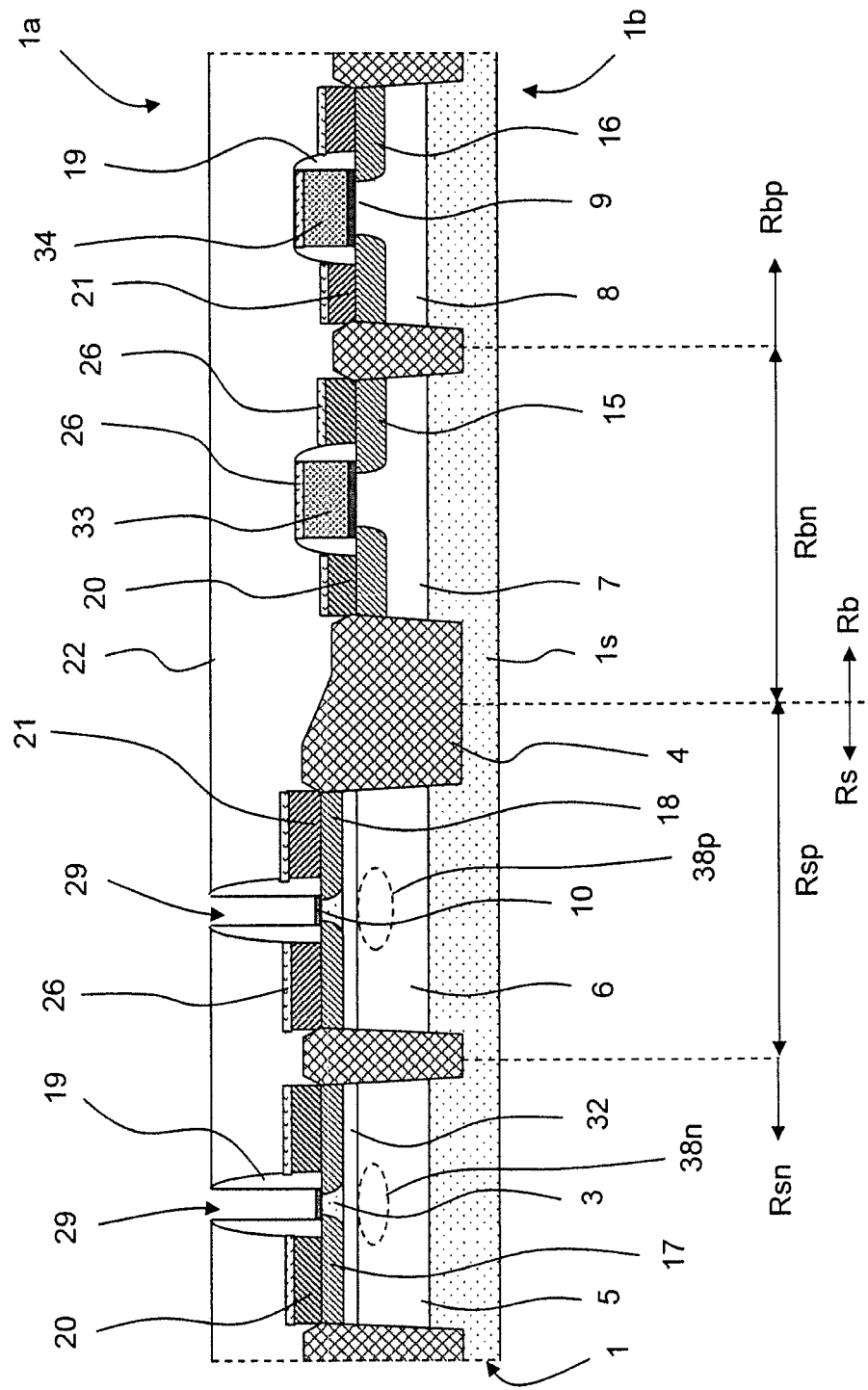
FIG. 31 is a device sectional view for explaining an example of the manufacturing method for a semiconductor integrated circuit device arranged for the modification (i.e. the back gate impurity additional implantation) in connection with the back gate impurity structure, which shows the device shown in FIG. 29 in course of the wafer process (specifically, the dummy gate removing process)

FIG. 30 is a device sectional view for explaining an example of the manufacturing method for a semiconductor integrated circuit device arranged for the modification (i.e. the back gate impurity additional implantation) in connection with the back gate impurity structure of the device shown in FIG. 29 in course of a wafer process (specifically, a well-forming process). FIG. 31 is a device sectional view for explaining an example of the manufacturing method for a semiconductor integrated circuit device arranged for the modification (i.e. the back gate impurity additional implantation) in connection with the back gate impurity structure, which shows the device shown in FIG. 29 in course of the wafer process (specifically, the dummy gate removing process). One example of the manufacturing method for a semiconductor integrated circuit device arranged for the modification (i.e. the back gate impurity additional implantation) in connection with the back gate impurity structure will be described with reference to the drawings.

First, in the same way as described in the section 2 with reference to FIG. 3, the SOI type N-channel MISFET well region 5, the SOI type P-channel MISFET well region 6, the bulk type N-channel MISFET well region 7, and the bulk type P-channel MISFET well region 8 are formed in turn by ion implantation from the side of the device plane 1a of the SOI wafer 1, as shown in FIG. 30. The examples of the condition for the implantation are as follows. In the case of making an N type well region, e.g. phosphorus is used, the implantation energy is 200 to 400 KeV, approximately, and the dose is $1 \times 10^{12}$ to $1 \times 10^{13}/cm^2$ approximately. In the case of making a P type well region, e.g. boron is used, the implantation energy is 100 to 200 KeV approximately, and the dose is $1 \times 10^{12}$ to $1 \times 10^{13}/cm^2$ approximately.

After that, the processes described with reference to FIGS. 4 to 8, and 10 to 14 in the section 2 are executed.

Next, ion implantation is executed on back gate regions of the SOI type N-channel MISFET well region 5 and the SOI type P-channel MISFET well region 6 (located just under the BOX layer) through gate-electrode-burying openings 29 in the state shown in FIG. 14, whereby additional impurity-doped regions, i.e. an SOI type N-channel MISFET well region additional impurity implantation region 38n and an SOI type P-channel MISFET well region additional impurity implantation region 38p are formed. As a result, it becomes possible to compensate the reduction in the impurity densities of the SOI type N-channel MISFET well region 5 and the SOI type P-channel MISFET well region 6 owing to thermal treatment. Examples of the condition for the implantation are as follows. In the case of making an N type well region, e.g. phosphorus is used, the implantation energy is 80 to 120 KeV approximately, and the dose is $1 \times 10^{12}$ to $1 \times 10^{13} / cm^2$ approximately. On the other hand, in the case of making a P type well region, e.g. boron is used, the implantation energy is 40 to 60 KeV approximately, and the dose is $1 \times 10^{13}$ to $1 \times 10^{14} / cm^2$ approximately.

7. Description of a modification (i.e. Fusi gate) in connection with the gate electrode structure of the semiconductor integrated circuit device according to the embodiment (See FIG. 32 chiefly.)

This section mainly describes "Fusi (Full Silicidation) gate" structure which are formed by totally silicifying the polycrystalline silicon gate electrodes without performing the gate electrode replacement in the CMP process described with reference to FIG. 13 in the section 2. However, the polycrystalline silicon gate electrodes may be entirely silicified without performing gate electrode replacement, assuming the basic structure as described in section 3 or 5.

The device structure described here is almost the same as that shown in FIG. 1 basically, and therefore only a difference will be described below as a rule.

Figure 32:
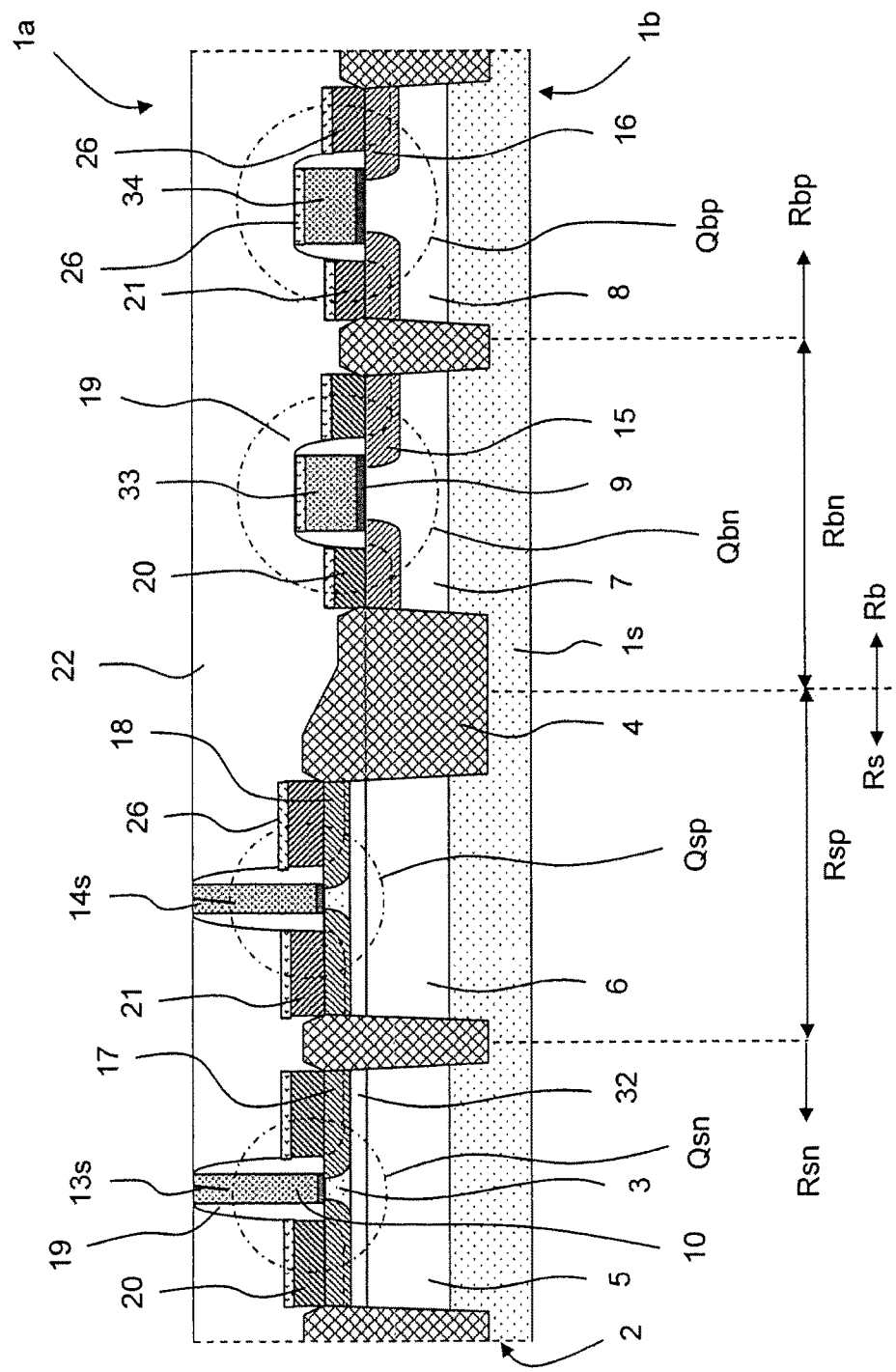
FIG. 32 is a device sectional view for explaining a modification (i.e. Fusi gate) in connection with the gate electrode structure of the semiconductor integrated circuit device according to the embodiment.

FIG. 32 is a device sectional view for explaining a modification (i.e. Fusi gate) in connection with the gate electrode structure of the semiconductor integrated circuit device according to the embodiment. With reference to the drawing, the modification (i.e. Fusi gate) in connection with the gate electrode structure of the semiconductor integrated circuit device according to the embodiment will be described.

As shown in FIG. 32, neither of the gate electrode 13s (first gate electrode) and the gate electrode 14s (third gate electrode) is a replacement gate, and the device is structured such that the entire gate electrodes are silicified (into e.g. nickel-based silicide).

8. Description of an example of the manufacturing method for a semiconductor integrated circuit device arranged for the modification (i.e. Fusi gate) in connection with the gate electrode structure (See FIG. 33 chiefly.)

This section concretely describes the manufacturing process assuming the device structure described in the section 7. However, it is needless to say that the manufacturing process may be applied to the device structures as described in the sections 3 and 5.

The entire flow of the process is exactly the same as described with reference to FIGS. 2 to 13 in the section 2. Therefore, only a difference will be described below.

Figure 33:
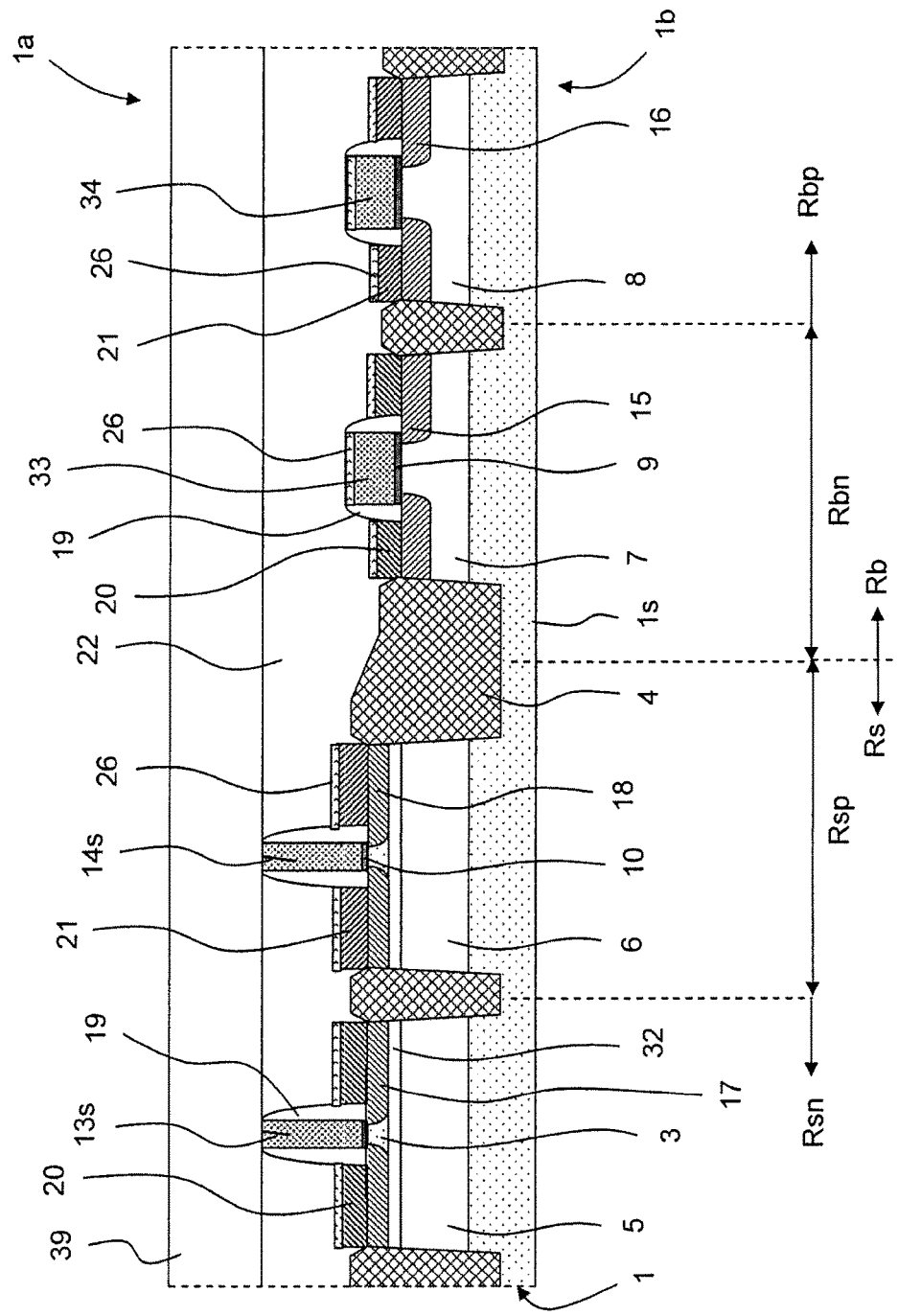
FIG. 33 is a device sectional view for explaining an example of the manufacturing method for a semiconductor integrated circuit device arranged for the modification (i.e. Fusi gate) in connection with the gate electrode structure, which shows the device shown in FIG. 32 in course of a wafer process (specifically, a gate electrode full silicification process).

FIG. 33 is a device sectional view for explaining an example of the method for manufacturing a semiconductor integrated circuit device arranged for the modification (i.e. Fusi gate) in connection with the gate electrode structure, which shows the device shown in FIG. 32 in course of a wafer process (specifically, a gate electrode full silicification process). With reference to the drawing, the example of the manufacturing method for a semiconductor integrated circuit device arranged for the modification (Fusi gate) in connection with the gate electrode structure will be described.

As shown in FIG. 33, a metal film 39 for full silicification composed of a nickel film or the like is formed almost all over the surface on the side of the device plane 1a of the wafer 1 by e.g. sputtering for film formation in the state as shown in FIG. 13, followed by a thermal treatment, whereby the entire polycrystalline silicon gate electrodes 13d and 14d (FIG. 13) are silicified. After that, the disused metal film 39 for full silicification is removed by wet etching using e.g. a mixture aqueous solution of nitric acid and hydrochloric acid, and thus the device is put in the state as shown in FIG. 32. The examples of the material of the metal film 39 for full silicification include nickel-based metals such as Ni and NiPt, and Co, W, and Ti.

After that, an auxiliary interlayer insulative film is formed, followed by making a contact hole, burying a tungsten plug, and conducting other processing, and then the FEOL process is completed. Thereafter, the process to be executed is transferred to the BEOL process, where a multilayer wiring line having an adequate number of layers (e.g. a copper-based buried wiring line) is formed as needed. Then, the pad metal layer, the final passivation film and the like are formed, and the requisite backside grinding and other processing are executed, and the resultant wafer 1 is divided into chips 2 by dicing or the like.

9. Supplementary explanation for the embodiments (including modifications), and consideration in general In the above embodiments, the SOI type N-channel MISFET (Qsn) and the SOI type P-channel MISFET (Qsp) are fabricated by Single metal-single High-k gate insulative film method by which titanium nitride (having a work function of about 4.6 eV) which is a mid-gap metal is used for a metal gate electrode (work function metal). That is, the same metal gate material is used for both of the first and third metal gate electrodes.

However, the invention is not so limited. For instance, the fabrication according to the dual metal method is enabled by executing following processes in turn after formation of a High-k gate insulative film: the formation of a film of N type metal (e.g. titanium nitride), the removal of N type metal with N type region masking, and the formation of a film of P type metal (e.g. tantalum nitride). In this case, the metal gate material of the first metal gate electrode is different from that of the third metal gate electrode.

As described above, in the embodiments, SOI/bulk-hybrid structure (both regions having CMIS circuit structure) is realized as the device structure inside a chip, and different gate stack structures are adopted for the bulk type MISFET formation region Rb and the SOI type MISFET formation region Rs respectively, which makes possible to ensure the performance and to simplify the process.

In terms of the process, the double-layer polycrystalline silicon process, and an elevation difference making means, e.g. making an elevation difference in a substrate top face (a lower face of BOX layer in the SOI type MISFET formation region Rs) are selected appropriately, whereby a gate electrode in the SOI type MISFET formation region Rs can be selected automatically by before-gate replacement or before-full silicification insulative film CMP.

In other words, in an example, the device is arranged so that the gate-last process is adopted on the SOI side, whereas the gate-first process is adopted on the bulk side. Further, in another example, the gate-first process is adopted both on the SOI side and the bulk side, and a gate electrode only on the SOI side is subjected to full silicification.

While the invention made by the inventor has been specifically described above based on the embodiments thereof, the invention is not limited so. It is obvious that various changes and modifications may be made without departing from the subject matter thereof.

For instance, the example of using, as a High-k gate insulative film of SOI part, a hafnium oxide-based High-k gate insulative film (HfON and HfO) including a HfSiON film has been herein described specifically. However, it is needless to say that the invention is not so limited, and another High-k gate insulative film may be used. In addition, the example of using, as the metal gate electrode of the SOI part, TiN has been herein described specifically. However, it is obvious that the invention is not so limited, and TaN, TaC, and other materials may be used.

What is claimed is:

1. A semiconductor integrated circuit device comprising:
    a semiconductor substrate having a first MISFET formation region, a second MISFET formation region, and a device isolation region located between the first MISFET formation region and the second MISFET formation region;
    an insulator layer formed in the first MISFET formation region, and formed on a surface of the semiconductor substrate;
    a semiconductor layer formed in the first MISFET formation region, and formed on the insulator layer;
    a first gate electrode formed in the first MISFET formation region, and formed on a surface of the semiconductor layer via a first gate insulative film;
    a second gate electrode formed in the second MISFET formation region, and formed on the surface of the semiconductor substrate via a second gate insulative film;
    a silicide film formed on the second gate electrode; and
    an interlayer insulative film formed over the surface of the semiconductor substrate such that a surface of the first gate electrode is exposed from the interlayer insulative film, and such that a surface of the silicide film is covered with the interlayer insulative film,
    wherein, in a cross-section view, a length from the surface of the semiconductor layer to the surface of the first gate electrode, which is along a thickness of the first gate electrode, is greater than a length from the surface of the semiconductor substrate to the surface of the silicide film, which is along a thickness of the second gate electrode.

2. The semiconductor integrated circuit device according to claim 1,
    wherein a gate length of the second gate electrode is greater than a gate length of the first gate electrode.

3. The semiconductor integrated circuit device according to claim 1,
    wherein the first gate electrode is comprised of a metal film, and
    wherein the second gate electrode is comprised of a polycrystalline silicon film.

4. The semiconductor integrated circuit device according to claim 1,
    wherein a side surface of the first gate electrode is covered with a first sidewall spacer,
    wherein a side surface of the second gate electrode is covered with a second sidewall spacer, and
    wherein, in cross-section view, a length from the surface of the semiconductor layer to a surface of the first sidewall spacer, which is along the thickness of the first gate electrode, is greater than a length from the surface of the semiconductor substrate to a surface of the second sidewall spacer, which is along the thickness of the second gate electrode.

5. The semiconductor integrated circuit device according to claim 4,
    wherein a thickness of the insulator layer is less than or equal to 15 nm, and
    wherein a thickness of the semiconductor layer is less than or equal to 20 nm.

6. The semiconductor integrated circuit device according to claim 5,
    wherein, in the first MISFET formation region, first elevated regions having an impurity therein are formed on the surface of the semiconductor layer at both sides of the first gate electrode via the first sidewall spacer.

* * * * *